United States Patent
Nishihara et al.

(10) Patent No.: US 6,809,401 B2
(45) Date of Patent: Oct. 26, 2004

(54) MEMORY, WRITING APPARATUS, READING APPARATUS, WRITING METHOD, AND READING METHOD

(75) Inventors: Takashi Nishihara, Osaka (JP); Rie Kojima, Osaka (JP); Noboru Yamada, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 558 days.

(21) Appl. No.: 10/084,863

(22) Filed: Oct. 19, 2001

(65) Prior Publication Data

US 2002/0131309 A1 Sep. 19, 2002

(30) Foreign Application Priority Data

Oct. 27, 2000 (JP) ........................................ 2000-328555

(51) Int. Cl.[7] ........................................ H01L 31/0256
(52) U.S. Cl. ........................................ 257/613
(58) Field of Search ........................ 257/2, 3, 4, 5, 257/41, 42, 49, 50, 51, 52, 613, 614, 615, 616

(56) References Cited

U.S. PATENT DOCUMENTS

| | | | |
|---|---|---|---|
| 3,271,591 A | 9/1966 | Ovshinsky | ............... 307/88.5 |
| 5,296,716 A | 3/1994 | Hudgens et al. | |
| 6,456,584 B1 * | 9/2002 | Nagata et al. | |

FOREIGN PATENT DOCUMENTS

| | | |
|---|---|---|
| EP | 0 449 121 | 10/1991 |
| EP | 1 187 119 | 3/2002 |
| JP | 60-164937 | 8/1985 |
| JP | 11-510317 | 9/1999 |

OTHER PUBLICATIONS

European Search Report regarding Application No. 01125119.6 dated Nov. 6, 2003.

* cited by examiner

*Primary Examiner*—Nathan J. Flynn
*Assistant Examiner*—Kevin Quinto
(74) *Attorney, Agent, or Firm*—Renner, Otto, Boisselle & Sklar, LLP

(57) ABSTRACT

A memory includes: first and second recording layers for recording information by utilizing a reversible phase change between a crystalline phase and an amorphous phase which occurs due to increases in temperature caused by application of an electric current pulse. The crystallization temperatures of the first and second recording layers, $T_{x1}$ and $T_{x2}$ have the relationship $T_{x1}<T_{x2}$. The crystallization times of the first and second recording layers, $t_{x1}$ and $t_{x2}$, have the relationship $t_{x1}>t_{x2}$. $R_{a1}+R_{a2}$, $R_{a1}+R_{c2}$, $R_{c1}+R_{a2}$, and $R_{c1}+R_{c2}$ are different from one another where the resistance value of the first recording layer in the amorphous phase is $R_{a1}$, the resistance value of the first recording layer in the crystalline phase is $R_{c1}$, the resistance value of the second recording layer in the amorphous phase is $R_{a2}$ and the resistance value of the second recording layer in the crystalline phase is $R_{c2}$.

36 Claims, 8 Drawing Sheets

FIG. 7
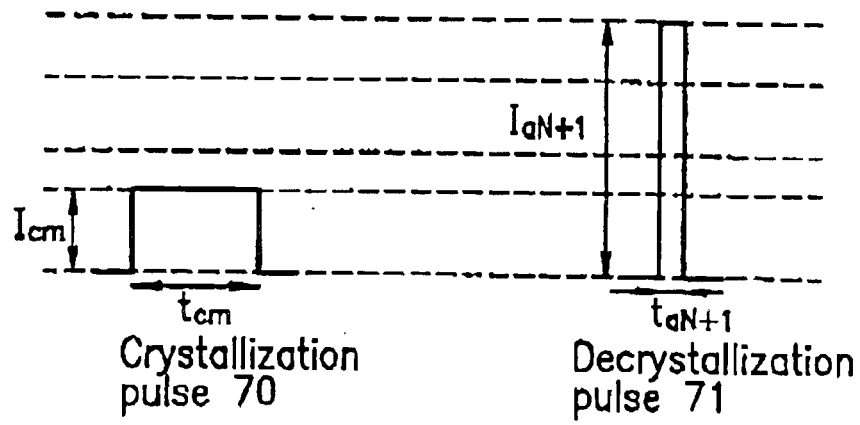
Crystallization pulse 70    Decrystallization pulse 71
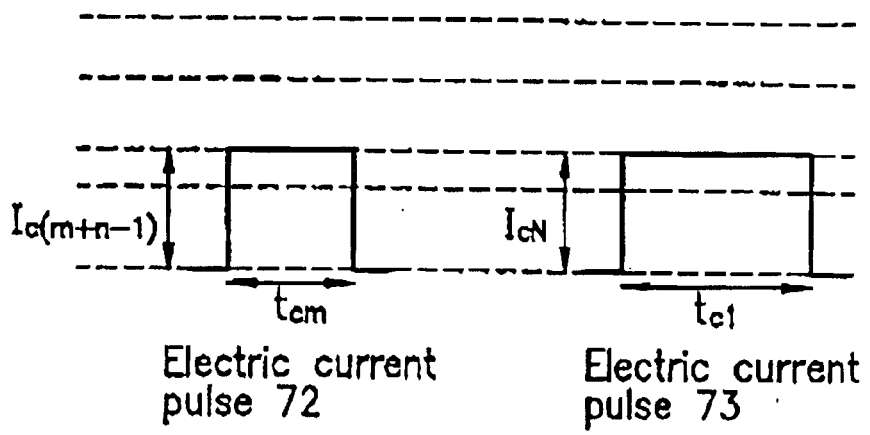
Electric current pulse 72    Electric current pulse 73
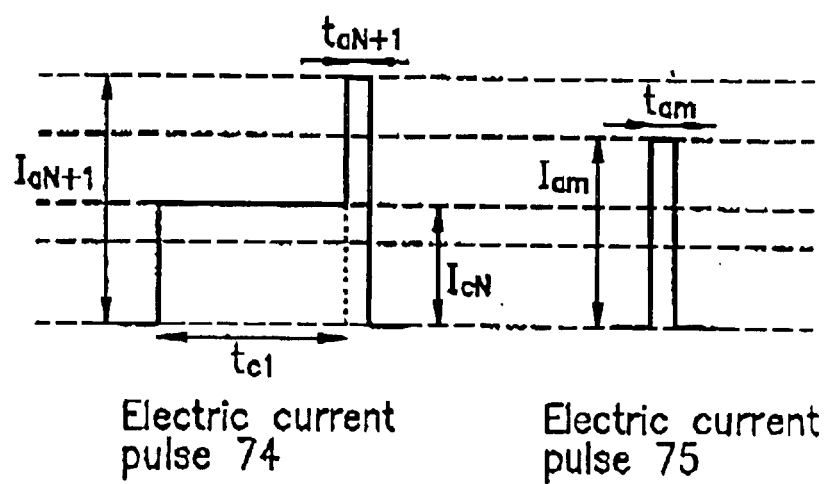
Electric current pulse 74    Electric current pulse 75

MEMORY, WRITING APPARATUS, READING APPARATUS, WRITING METHOD, AND READING METHOD

BACKGROUND OF THE INVENTION

1. Field of the Inventions

The present invention relates to a phase-change memory for storing information by utilizing a reversible phase change which may occur between a crystalline phase and an amorphous phase, a writing apparatus for writing information in the memory, a reading apparatus for reading information from the memory, and writing/reading methods therefor.

2. Description of the Related Art

A phase-change memory in which information can be, recorded or erased by applying electric energy such as an electric current is known. The material used as a recording layer of such a phase-change memory causes reversible change between the crystalline phase and the amorphous phase due to increases in temperature which results from the application of the electric energy. Generally, the electric resistance of the crystalline phase is low, whereas the electric resistance of the amorphous phase is high. The phase-change memory is a non-volatile memory in which binary information is recorded by utilizing the difference in electric resistance between the crystalline phase and the amorphous phase.

In recent years, along with the increase in amount of information to be recorded in a memory, a memory having a larger capacity has been demanded. In order to increase the capacity of a phase-change memory, two suggestions have been provided: (1) the area of a memory cell for recording a binary value a reduced, and a plurality of such memory; cells are arranged in a matrix (increase in surface density) (2) information of a multi-value is stored in a single memory cell. In this specification, the "multi-value" does not include the "binary value".

Regarding suggestion (1) since there is a limit to a miniaturization process in a production technique such as photolithography, there is also a limit to the increase in surface density. Thus, it is impossible to drastically increase the capacity of a phase-change memory.

A known conventional technique for recording multi-value information in a single memory cell is disclosed in Japanese National Phase PCT Laid-Open Publication No. 11-510317. According to this conventional technique, the resistance value of a recording layer of a memory cell is controlled in a stepwise manner, whereby multi-value information can be stored in the memory cell. However, such a stepwise control of the phase state in a single recording layer involves greater difficulty rather than control of the phase state between the two phase states, i.e., the crystalline phase and the amorphous phase.

SUMMARY OF THE INVENTION

According to one aspect of the present invention, a memory includes: a first recording layer for recording information by utilizing a reversible phase change between a crystalline phase and an amorphous phase which occurs due to increases in temperature caused by application of an electric current pulse; and a second recording layer for recording information by utilizing a reversible phase change between a crystalline phase and an amorphous phase which occurs due to increases in temperature caused by application of an electric current pulse, wherein the crystallization temperature of the first recording layer, $T_{x1}$, and the crystallization temperature of the second recording layer, $T_{x2}$, have the relationship $T_{x1} < T_{x2}$, the crystallization time of the first recording layer, $t_{x1}$ and the crystallization time of the second recording layer, $t_{x2}$, have the relationship $t_{x1} > t_{x2}$, and $R_{a1}+R_{a2}$, $R_{a1}+R_{c2}$, $R_{c1}+R_{a2}$, and $R_{c1}+R_{c2}$ are different from one another where the resistance value of the first recording layer In the amorphous phase is $R_{a1}$ the resistance value of the first recording layer in the crystalline phase is $R_{c1}$ the resistance value of the second recording layer in the amorphous phase is $R_{a2}$, and the resistance value of the second recording layer in the crystalline phase is $R_{c2}$.

In one embodiment of the present invention, the melting point of the first recording layer, $T_{m1}$, satisfies the relationship $400 \leq T_{m1}(°C.) \leq 800$.

In another embodiment of the present invention, the melting point of the second recording layer, $T_{m2}$, satisfies the relationship $300 \leq T_{m2}(°C.) \leq 700$.

In still another embodiment of the present invention, the crystallization temperature of the first recording layer, $T_{x1}$, satisfies the relationship $130 \leq T_{x1}(°C.) \leq 230$.

In still another embodiment of the present invention, the crystallization temperature of the second recording layer, $T_{x2}$, satisfies the relationship $160 \leq T_{x2}(°C.) \leq 260$.

In still another embodiment of the present invention, the crystallization time of the first recording layer, $t_{x1}$, satisfies the relationship $5 t_{x1}(ns) \leq 200$.

In still another embodiment of the present invention, the crystallization time of the second recording layer, $t_{x2}$, satisfies the relationship $2 \leq tx_{x2}(ns) \leq 150$.

In still another embodiment of the present invention, the first recording layer includes three elements, Ge, Sb, and Te; and the second recording layer includes (Sb-Te)-Ml, where Ml is at least one selected from a group consisting of Ag, In, Ge, Sn, Se, Bi, Au, and Mn.

In still another embodiment of the present invention, the first recording layer is formed on a substrate, and the upper electrode is formed on the second recording layer.

In still another embodiment of the present invention, a lower electrode is formed between the substrate and the first recording layer.

In still another embodiment of the present invention, an intermediate layer is formed between the first recording layer and the second recording layer.

In still another embodiment of the present invention, the specific resistance $r_{a1}$, of the first recording layer in the amorphous phase is $1.0 \leq r_{a1}(\Omega \cdot cm) \leq 1 \times 1 \times 10^7$.

In still another embodiment of the present invention, the specific resistance $r_{a2}$, of the second recording layer in the amorphous phase is $2.0 \leq r_{a2}(\Omega \cdot cm) \leq 2 \times 10^7$.

In still another embodiment of the present invention, the specific resistance $r_{c1}$ of the first recording layer in the crystalline phase is $1 \times 10^{-3} \leq r_{c1}(\Omega \cdot cm) \leq 1.0$.

In still another embodiment of the present invention, the specific resistance $r_{c2}$ of the second recording layer in the crystalline phase is $1 \times 10^{-3} \leq r_{c2}(\Omega \cdot cm) \leq 1.0$.

According to another aspect of the present invention, there is provided a writing apparatus for writing information in a memory, the memory including: a first recording layer for recording information by utilizing a reversible phase change between a crystalline phase and an amorphous phase which occurs due to increases in temperature caused by application of an electric current pulse; and a second, recording layer for recording information by utilizing a reversible phase change between a crystalline phase and an amorphous phase which occurs due to increases in temperature caused by application of an electric current pulse, wherein the crystallization temperature of the first recording layer, $T_{x1}$ and the crystallization temperature of the second recording layer, $T_{x2}$, have the relationship $T_{x1}<T_{x2}$, the crystallization time of the first recording layer, $t_{x1}$ and the crystallization time of the second recording layer $t_{x2}$, have the relationship $t_{x1}>t_{x2}$, and $R_{a1}+R_{a2}$, $R_{a1}+R_{c2}$, and $R_{c1}+R_{c2}$ are different from one another where the resistance value of the first recording layer in the amorphous phase is $R_{a1}$, the resistance value of the first recording layer in the crystalline phase is $R_{c1}$, the resistance value of the second recording layer in the amorphous phase is $R_{a2}$, and the resistance value of the second recording layer in the crystalline phase is $R_{c2}$, and the writing apparatus including: a pulse generator for generating at least first to third electric current pulses and an application section through which the at least first to third electric current pulses are applied to the first recording layer and the second recording layer, wherein in order to change the first recording layer from the amorphous phase to the crystalline phase while the phase state of the second recording layer is kept unchanged, the pulse generator generates the first electric current pulse which provides a temperature (T) that satisfies $T_{x1} \leq T < T_{x2}$ during a time (t) that satisfies $t_{x1} \leq t$, in order to change the second recording layer from the amorphous phase to the crystalline phase while the phase state of the first recording layer is kept unchanged, the pulse generator generates the second electric current pulse which provides a temperature (T) that satisfies $T_{x2} \leq T$ during a time (t) that satisfies $t_{x2} \leq t < t_{x1}$, and in order to change both the first recording layer and the second recording layer from the crystalline phase to the amorphous phase, the pulse generator generates the third electric current pulse which provides a temperature equal to or higher than the higher one of the melting points of the first and second recording layers.

In one embodiment of the present invention, the pulse amplitude of the first electric current pulse, $I_{c1}$, is $0.02 \leq I_{c1}$ (mA) $\leq 10$, and the pulse width of the first electric current pulse, $t_{c1}$, is $5 \leq t_{c1}(ns) \leq 200$.

In another embodiment of the present invention, the pulse amplitude of the second electric current pulse, $I_{c2}$, is $0.05 \leq I_{c2}(mA) \leq 20$, and the pulse width of the second electric current pulse, $t_{c2}$, is $2 \leq t_{c2}(ns) \leq 150$.

In still another embodiment of the present invention, the pulse amplitude of the third electric current pulse, $I_{a1}$, is $0.1 \leq I_{a1}(mA) \leq 200$, and the pulse width of the third electric current pulse, $t_{a1}$, is $1 \leq t_{a1}(ns) \leq 100$.

In still another embodiment of the present invention, in order to change both the first recording layer and the second recording layer from the amorphous phase to the crystalline phase, the pulse generator generates a fourth electric current pulse which provides a temperature (T) that satisfies $T_{x2} \leq T$ during a time (t) that satisfies $t_{x1} \leq t$.

In still another embodiment of the present invention, the pulse amplitude of the fourth electric current pulse, $I_{c12}$, is $0.05 \leq I_{c12}(mA) \leq 20$, and the pulse width of the fourth electric current pulse, $t_{c12}$, is $5 \leq t_{c12}(ns) \leq 200$.

In still another embodiment of the present invention, when the melting point of the first recording layer, $T_{m1}$, and the melting point of the second recording layer, $T_{m2}$, have the relationship $T_{m1}$ and $T_{m2}$, in order to change the recording layer having the lower one of the melting points $T_{m1}$ and $T_{m2}$ from the crystalline phase to the amorphous phase while the phase state of the recording layer having the higher one of the melting points $T_{m1}$ and $T_{m2}$ is kept at the crystalline phase, the pulse generator generates a fifth electric current pulse which provides a temperature equal to or higher than the lower one of the melting points $T_{m1}$ and $T_{m2}$ and lower then the higher one of the melting points $T_{m1}$ and $T_{m2}$.

In still another embodiment of the present invention, the pulse amplitude of the fifth electric current pulse, $I_{a2}$, is $0.05 \leq I_{a2}(mA) \leq 160$, and the pulse width of the fifth electric current pulse, $t_{a2}$, is $1 \leq t_{a2}(ns) \leq 100$.

According to still another aspect of the present invention, there is provided a reading apparatus for reading information from a memory, the memory including: a first recording layer for recording information by utilizing a reversible phase change between a crystalline phase and an amorphous phase which occurs due to increases in temperature caused by application of an electric current pulse; and a second recording layer for recording information by utilizing a reversible phase change between a crystalline phase and an amorphous phase which occurs due to increases in temperature caused by application of an electric current pulse, wherein the crystallization temperature of the first recording layer, $T_{x1}$, and the crystallization temperature of the second recording layer, $T_{x2}$, have the relationship $T_{x1}<T_{x2}$, the crystallization time of the first recording layer, $t_{x1}$, and the crystallization time of the second recording layer, $t_{x2}$, have the relationship $t_{x1}>t_{x2}$, and $R_{a1}+R_{a2}$, $Ra_{a1}+R_{c2}$, $R_{c1}+R_{a2}$, and $R_{c1}+R_{c2}$ are different from one another where the resistance value of the first recording layer in the amorphous phase is $R_{a1}$ the resistance value of the first recording layer in the crystalline phase is $R_{c1}$, the resistance value of the second recording layer in the amorphous phase is $R_{a2}$, and the resistance value of the second recording layer in the crystalline phase is $R_{c2}$, and the reading apparatus including; an application section through which an electric current pulse is applied to the first and second recording layers; a resistance measurement device for measuring a sum of the resistances of the first and second recording layers; and a determination section for determining which of the four different sums of resistance values, $R_{a1}+R_{a2}$, $R_{a1}+R_{c2}$, $R_{c1}+R_{a2}$, and $R_{c1}+R_{c2}$, the measured sum of the resistance values of the first and second recording layers is equal to.

In one embodiment of the present invention, the electric current pulse has an amplitude $I_r$ having a size such that a phase change is not caused in the first and second recording layers.

In another embodiment of the present invention, the amplitude $I_r$ of the electric current pulse is $I_r$, (mA)$\leq 0.02$.

According to still another aspect of the present invention, a memory includes N recording layers (N is a natural number which satisfies N>2) for recording information by utilizing a reversible phase change between a crystalline phase and an amorphous phase which occurs due to increases in temperature caused by application of an electric current pulse, wherein the crystallization temperature $T_{xm}$ of the m-th recording layer ($1 \leq m \leq N$) satisfies the relationship $T_{x1}<T_{x2}<\ldots<T_{xm-1}, <T_{xm}<T_{xm+1}<\ldots <T_{xn}$, the crystallization time $t_{xm}$ of the m-th recording layer satisfies the relationship $t_{x1}>t_{x2}>\ldots >t_{xm-1}>t_{xm}>t_{xm+1}>\ldots >t_{xN}$, and the resistance values of the N recording layers in the amorphous phase are different from one another, the resistance values of the N recording layers in the crystalline phase are different from one another, and the sum of the resistance values of the N recording layers is one of $2^N$ values.

According to still another aspect of the present invention, there is provided a writing apparatus for writing information in a memory, the memory including N recording layers (N is a natural number which satisfies N>2) for recording information by utilizing a reversible phase change between a crystalline phase and an amorphous phase Which occurs due to increases in temperature caused by application of an electric current pulse, wherein the crystallization temperature $T_{xm}$ of the m-th recording layer ($1 \leq m \leq N$) satisfies the relationship $T_{x1}<T_{x2}<\ldots<T_{xm-1}<T_{xm}<T_{xm+1}<\ldots<T_{xn}$, the crystallization time to of the m-th recording layer satisfies the relationship $t_{x1}>t_{x2}>\ldots>t_{xm-1}>t_{xm}>t_{xm+1}>\ldots t_{xN}$, and the resistance values of the N recording layers in the amorphous phase are different from one another, the resistance values of the N recording layers in the crystalline phase are different from one another, and the sum of the resistance values of the N recording layers is one of $2^N$ values, and the writing apparatus including a pulse generator for generating at least N crystallization pulses and amorphization pulse, and an application section through which the at least N crystallization pulses and amorphization pulse are applied to the N recording layers, wherein in order to change only the m-th recording layer from the amorphous phase to this crystalline phase while the phase states of the other recording layers are kept unchanged, the pulse generator generates a crystallization pulse which provides a temperature (T) that satisfies $T_{xm} \leq T_x < T_{x(m+1)}$ during a time (t) that satisfies $t_{xm} \leq t_x < t_{x(m-1)}$, and in order to change all of the N recording layers from the crystalline phase to the amorphous phase, the pulse generator generates the amorphization pulse which provides a temperature equal to or higher than the highest one of the melting points of the N recording layers.

In one embodiment of the present invention, in order to change all of the N recording layers from the amorphous phase to the crystalline phase, the pulse generator generates an electric current pulse which provides a temperature (T) that satisfies $T_{xN} \leq T_x$ during a time (t) that satisfies $t_{x1} \leq t_x$.

In another embodiment of the present invention, in order to change the m-th to (m+n−1)th recording layers among the N recording layers from the amorphous phase to the crystalline phase, the pulse generator generates an electric current pulse which provides a temperature (T) that satisfies $T_{x(m+n-1)} \leq T_{x(m+n)}$ during a time (t) that satisfies $t_{xm} \leq t_x < t_{x(m-1)}$.

In another embodiment of the present invention, when each of one or more recording layers among the N recording layers has a melting point equal to or lower than a temperature $T_m$, and each of the other recording layers among the N recording layers has a melting point higher than the temperature $T_m$, in order to change the one or more recording layers from the crystalline phase to the amorphous phase while the other recording layers are kept at the crystalline phase, the pulse generator generates an electric current pulse which produces the temperature $T_m$.

According to still another aspect of the present invention, there is provided a reading apparatus for reading information from a memory, the memory including N recording layers (N is a natural number which satisfies N>2) for recording information by utilizing a reversible phase change between a crystalline phase and an amorphous phase which occurs due to increases in temperature caused by application of an electric current pulse, wherein the crystallization temperature $T_{xm}$ of the m-th recording layer ($1 \leq m \leq N$) satisfies the relationship $T_{x1}<T_{x2}<\ldots<T_{xm-1}<T_{xm}<T_{xm+1}<\ldots<T_{xN}$, the crystallization time $t_{xm}$ of the m-th recording layer satisfies the relationship $t_{x1}>t_{x2}>\ldots>t_{xm-1}>t_{xm}>t_{xm+1}>\ldots>t_{xN}$, and the resistance values of the N recording layers in the amorphous phase are different from one another, the resistance values of the N recording layers in the crystalline phase are different from one another, and the sum of the resistance values of the N recording layers is one of $2^N$ values, and the reading apparatus including: an application section through which an electric current pulse is applied to the N recording layers; a resistance measurement device for measuring a sum of the resistances of the N recording layers; and a determination section for determining which of the $2^N$ different values for the sum of resistance values the measured sum of the resistance values of the N recording layers is equal to.

According to still another aspect of the present invention, there is provided a method for writing information in a memory, the memory including: a first recording layer for recording information by utilizing a reversible phase change between a crystalline phase and an amorphous phase which occurs due to increases in temperature caused by application of an electric current pulse: and a second recording layer for recording information by utilizing a reversible phase change between a crystalline phase and an amorphous phase which occurs due to increases in temperature caused by application of an electric current pulse, wherein the crystallization temperature of the first recording layers $T_{x1}$, and the crystallization temperature of the second recording layer, $T_{x2}$, have the relationship $T_{x1}<T_{x2}$, the crystallization time of the first recording layer, $t_{x1}$ and the crystallization time of the second recording layer, $t_{x2}$, have the relationship $t_{x1}>t_{x2}$, and $R_{a1}+R_{a2}$, $R_{a1}+R_{c2}$, $R_{c1}+R_{a2}$, and $R_{c1}+R_{c2}$ are different from one another where the resistance value of the first recording layer in the amorphous phase as $R_{a1}$, the resistance value of the first recording layer in the crystalline phase is $R_{c1}$, the resistance value of the second recording layer in the amorphous phase is $R_{a2}$, and the resistance value of the second recording layer in the crystalline phase is $R_{c2}$ and the writing method including steps of: generating at least first to third electric current pulses; and applying the at least first to third electric current pulses to the first recording layer and the second recording layer, wherein, in the step of generating the at least first to third electric current pulses, in order to change the first recording layer from the amorphous phase to the crystalline phase while the phase state of the second recording layer is kept unchanged, the pulse generator generates the first electric current pulse which provides a temperature (T) that satisfies $T_{x1} \leq T < T_{x2}$ during a time (t) that satisfies $t_{x1} \leq t$, in order to change the second recording layer from the amorphous phase to the crystalline phase while the phase state of the first recording layer is kept unchanged, the pulse generator generates the second electric current pulse which provides a temperature (T) that satisfies $T_{x2} \leq T$ during a time (t) that satisfies $t_{x2} \leq t < t_{x1}$ and in order to change both the first recording layer and the second recording layer from the crystalline phase to the amorphous phase, the pulse generator generates the third electric current pulse which provides a temperature equal to or higher than the higher one of the melting points of the first and second recording layers.

According to still another aspect of the present invention, there is provided a method for reading information from a memory, the memory including: a first recording layer for recording information by utilizing a reversible phase change between a crystalline phase and an amorphous phase which occurs due to increases in temperature caused by application of an electric current pulse; and a second recording layer for recording information by utilizing a reversible phase change between a crystalline phase and an amorphous phase which occurs due to increases in temperature caused by application of an electric current pulse, wherein the crystallization temperature of the first recording layer, $T_{x1}$ and the crystallization temperature of the second recording layer, $T_{x2}$, have the relationship $T_{x1}<T_{x2}$, the crystallization time of the first recording layer, $t_{x1}$ and the crystallization time of the second recording layer, $t_{x2}$, have the relationship $t_{x1}>t_{x2}$, and $R_{a1}+R_{a2}$, $R_{a1}+R_{a2}$, $R_{c1}+R_{a2}$, and $R_{c1}+R_{c2}$ are different from one another where the resistance value of the first recording layer in the amorphous phase is $R_{a1}$ the resistance value of the first recording layer in the crystalline phase is $R_{c1}$, the resistance value of the second recording layer in the amorphous phase is $R_{a2}$, and the resistance value of the second recording layer in the crystalline phase is $R_{c2}$, and the reading method including steps of: applying an electric current pulse to the first recording layer and the second recording layer; measuring a sum of the resistances of the first and second recording layers; and determining which of the four different sums of resistance values, $R_{a1}+R_{a2}$, $R_{a1+Rc2}$, $R_{c1}+R_{a2}$, and $R_{c1}+_{c2}$, the measured sum of the resistance values of the first and second recording layers is equal to.

According to still another aspect of the present invention, there is provided a method for writing information in a memory, the memory including N recording layers (N is a natural number which satisfies N>2) for recording information by utilizing a reversible phase change between a crystalline phase and an amorphous phase which occurs due to increases in temperature caused by application of an electric current pulse, wherein the crystallization temperature $T_{xm}$ of the m-th recording layer ($1 \leq m \leq N$) satisfies the relationship $T_{x1}<T_{x2}<\ldots<T_{xm-1}<T_{xm}<T_{xm+1}<\ldots<T_{xN}$, the crystallization time $t_{xm}$ of the m-th recording layer satisfies the relationship $t_{x1}>t_{x2}>\ldots>t_{xm-1}>t_{xm}>t_{xm+1}>\ldots>t_{xN}$, and the resistance values of the N recording layers in the amorphous phase are different from one another, the resistance values of the N recording layers in the crystalline phase are different from one another, and the sum of the resistance values of the N recording layers is one of $2^N$ values, and the writing method including steps of: generating at least N crystallization pulses and amorphization pulse, and applying the at least N crystallization pulses and amorphization pulse to the N recording layers, wherein, in the step of generating the first to (N+1)th electric current pulses, in order to change only the m-th recording layer from the amorphous phase to the crystalline phase while the phase states of the other recording layers are kept unchanged, the pulse generator generates a crystallization pulse which provides a temperature (T) that satisfies $T_{xm} \leq T_x < T_{x(m+1)}$ during a time (t) that satisfies $t_{xm} \leq t_x < t_{x(m-1)}$, and in order to change all of the N recording layers from the crystalline phase to the amorphous phase, the pulse generator generates the amorphization pulse which provides a temperature equal to or higher than the highest one of the melting points of the N recording layers.

According to still another aspect of the present invention, there is provided a method for reading information from a memory, the memory including N recording layers (N is a natural number which satisfies N>2) for recording information by utilizing a reversible phase change between a crystalline phase and an amorphous phase which occurs due to increases in temperature caused by application of an electric current pulse, wherein the crystallization temperature $T_{xm}$ of the m-th recording layer ($1 \leq m \leq N$) satisfies the relationship $T_{x1}<T_{x2}<\ldots<T_{xm-1}<T_{xm}<T_{xm+1}<\ldots<T_{xN}$, the crystallization time $t_{xm}$ of the m-th recording layer satisfies the relationship $t_{x1}>t_{x2}>\ldots>t_{xm-1}>t_{xm}>t_{xm+1}>\ldots>t_{xN}$, and the resistance values of the N recording layers in the amorphous phase are different from one another, the resistance values of the N recording layers in the crystalline phase are different from one another, and the sum of the resistance values of the N recording layers is one of $2^N$ values, and the reading method including steps of: applying an electric current pulse to the N recording layers; measuring a sum of the resistances of the N recording layers; and determining which of the $2^N$ different values for the sum of resistance values the measured sum of the resistance values of the N recording layers is equal to.

Thus, the invention described herein makes possible the advantages of providing: a phase-change memory which stores multi-value information and in which writing and reading of information can be readily performed: a writing apparatus for writing information in such a phase-change memory; a reading apparatus for reading information from such a phase-change memory, and writing and reading methods employed in conjunction with such a phase-change memory.

These and other advantages of the present invention will become apparent to those skilled in the art upon reading and understanding the following detailed description with reference to the accompanying figures.

BRIEF DESCRIPTION OF THE DRAWINGS

FIG. 7 shows the waveforms of electric current pulses employed to change the phase states of the N recording layers.

DESCRIPTION OF THE PREFERRED EMBODIMENTS

Hereinafter, embodiments of the present invention will be described with reference to the drawings.

EMBODIMENT 1

Figure 1:
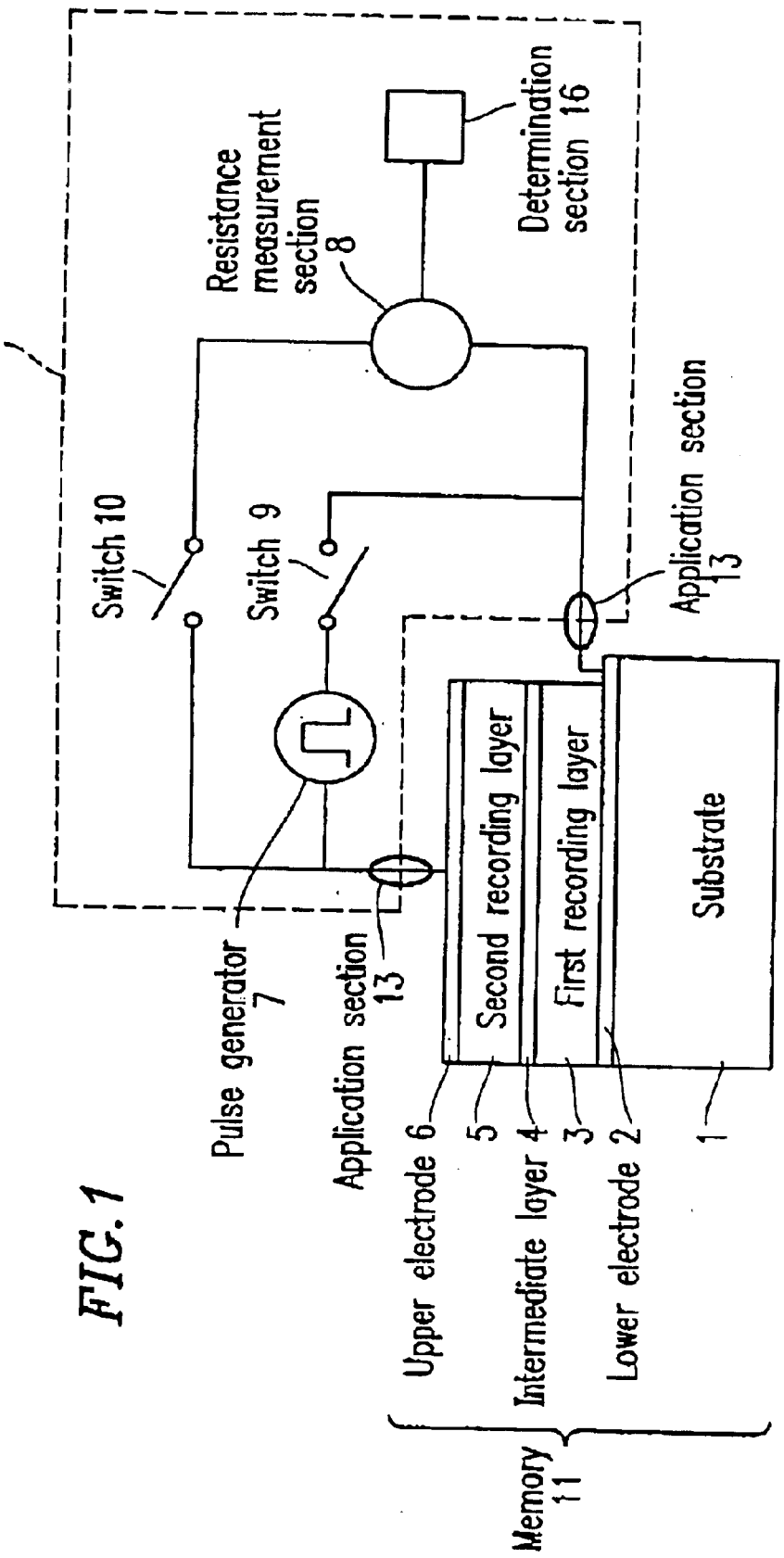
FIG. 1 shows a structure of a writing/reading apparatus connected to a memory according to the present invention.

FIG. 1 shows a structure of a writing/reading apparatus connected to a memory according to the present invention. The writing/reading apparatus 12 writes information in the memory 11 or reads information from the memory 11.

The writing/reading apparatus 12 includes a pulse generator 7 for generating an electric current pulse, a resistance measurement section 8 for measuring the resistance of the memory 11, switches 9 and 10, application sections 13 for applying an electric current pulse generated by the pulse generator 7 to the memory 11, and a determination section 16 for determining the resistance value of the memory 11 measured by the resistance measurement section 8.

The memory 11 includes a substrate 1, a lower electrode 2 formed over the substrate 1, a first recording layer 3 formed over the lower electrode 2, an intermediate layer 4 formed over the first recording layer 3, a second recording layer 5 formed over the intermediate layer 4, and an upper electrode 6 formed over the second recording layer 5.

For example, as the substrate 1, a resin plate of polycarbonate or the like, a glass plate, a ceramic plate of alumina ($Al_2O_3$) or the like, an Si plate, metal plates of Cu or the like, etc., may be used, but the present invention is not limited to these examples. In embodiment 1, an Si substrate is used as the substrate 1. As the lower electrode 2 and the upper electrode 6, for example, a single metal material, such as Al, Au, Ag, Cu, Pt, Ti, W, etc., or a combination thereof (alloy material) may be used. However, according to the present invention, any electrode material may be used so long as electric energy can be applied to the first recording layer 3 and the second recording layer 5 through the electrodes 2 and 6. The intermediate layer 4 is provided for preventing atoms which constitute one of the first recording layer 3 and the second recording layer 5 from diffusively moving therebetween. The intermediate layer 4 is preferably electrically conductive and may be made of a single metal material, such as Al, Au, Ag, Cu, Pt, Ti, W. etc., or a combination thereof (alloy material). However, the material of the intermediate layer 4 is not limited to these materials. In embodiment 1, Pt is used in the lower electrode 2, the intermediate layer 4, and the upper electrode 6.

It should be noted that any structure for applying an electric current pulse to the first recording layer 3 and the second recording layer 5 can be employed in place of the lower electrode 2 and/or the upper electrode 6. For example, If the substrate 1 is electrically conductive, the lower electrode 2 can be omitted. Furthermore, the intermediate layer 4 may be omitted when the first recording layer 3 and the second recording layer 5 are made of such a material that atoms constituting the recording layers 3 and 5 do not diffusively moves therebetween.

Furthermore, the first recording layer 3 and the second recording layer 5 are made of such a material that a reversible phase change between the crystalline phase and the amorphous phase is caused by increases in temperature due to application of electric energy such as an electric pulse or the like. The material of the first recording layer 3 and the second recording layer 5 is selected such that the following conditions 1–3 are satisfied Condition 1: The crystallization temperature of the first recording layer 3. $T_{x1}$, and the crystallization temperature of the second recording layer 5, $t_{x2}$, satisfy the relationship $T_{x1}<T_{2x}$. In this specification, "crystallization temperature" means a temperature at which the material of a recording layer changes from the amorphous phase to the crystalline phase.

Condition 2: The crystallization time of the first recording layer 3, $t_{x1}$, and the crystallization time of the second recording layer 5, $t_{x2}$, satisfy the relationship $t_{x1}>t_{x2}$. In this specification, "crystallization time" means a time spent during which the material of a recording layer changes from the amorphous phase to the crystalline phase.

Condition 3: Where the resistance value of the first recording layer 3 in the amorphous phase is $R_{a1}$, the resistance value of the first recording layer 3 in the crystalline phase is $R_{c1}$, the resistance value of the second recording layer 5 in the amorphous phase is $R_{a2}$, and the resistance value of the second recording layer 5 in the crystalline phase is $R_{c2}$, $R_{a1}+R_{a2}$, $R_{a1}+R_{c2}$, $R_{c1}+R_{a2}$, and $R_{c1}+R_{c2}$ are different from one another.

By satisfying Condition 1 and Condition 2, the phase state of the first recording layer 3 and the phase state of the second recording layer 5 each can be set to a desired state (amorphous phase or crystalline phase). Moreover, by satisfying Condition 3, four states represented by combinations of the phase state of the first recording layer 3 and the phase state of the second recording layer 5 can be distinguishably detected. Thus, the first recording layer 3 and the second recording layer 5 of the memory 11 can store 4-value information (2 bits) corresponding to the four states. In this structure, the phase state of each recording layer is controlled between the crystalline phase and the amorphous phase. This is easier than a stepwise control of the phase state of a single recording layer.

The crystallization temperature $T_{x1}$ of the first recording layer 3 is preferably $130 \leq T_{x1}(°C.) \leq 230$. The crystallization temperature $T_{x2}$ of the second recording layer 5 is preferably $160 \leq T_{x2}(°C.) \leq 260$. The crystallization time $t_{x1}$ of the first recording layer 3 is preferably $5 \leq t_{x1}(ns) \leq 200$. The crystallization time $t_{x2}$ of the second recording layer 5 is preferably $2 \leq t_{x2}(ns) \leq 150$.

The specific resistance $r_{a1}$, of the first recording layer 3 in the amorphous phase is preferably $1.0 \leq r_{a1}(\Omega \cdot cm) \leq 10^7$. The specific resistance $r_{a2}$ of the second recording layer 5 in the amorphous phase is preferably $2.0 \leq r_{a2}(\Omega \cdot cm) \leq 2 \times 10^7$. The specific resistance $r_{c1}$ of the first recording layer 3 in the crystalline phase is preferably $1 \times 10^{-3} \leq r_{c1}(\Omega \cdot cm) \leq 1.0$. The specific resistance $ra_{c2}$ of the second recording layer 5 in the crystalline phase is preferably $1 \times 10^{-3} \leq r_{c2}(\Omega \cdot cm) \leq 1.0$.

In embodiment 1, the melting point of the first recording layer 3, $T_{m1}$, and the melting point of the second recording layer 5, $T_{m2}$, have the relationship $T_{m1}>T_{m2}$. However, according to the present invention, these melting points $T_{m1}$ and $T_{m2}$ may have any relationship. In embodiment 1, the melting point $T_{m1}$ of the first recording layer 3 and the melting point $T_{m2}$ of the second recording layer 5 are 630° C. and 550° C., respectively. According to the present invention, the melting point $T_{m1}$ of the first recording layer 3 is preferably $400 \leq T_{m1}(°C.) \leq 800$, and the melting point $T_{m2}$ of the second recording layer 5 is preferably $300 \leq T_{m2}(°C.) \leq 700$.

The first recording layer 3 includes three elements, Ge, Sb, and Te. The second recording layer 5 includes a material system represented by (Sb-Te)-Ml where Ml is at least one selected from a group consisting of Ag, In, Ge, Sn, Se, Bi, Au, and Mn. In embodiment 1, the first recording layer 3 and the second recording layer 5 are $Ge_8Sb_2Te_{11}$ and $(Sb_{0.7}Te_{0.3})_{95}Ge_5$, respectively.

In embodiment 1, the crystallization temperature $T_{x1}$ of the first recording layer 3 and the crystallization temperature $T_{x2}$ of the second recording layer 5 are 170° C. and 200° C., respectively. The crystallization time $t_{x1}$ of the first recording layer 3 and the crystallization time $t_{x2}$ of the second recording layer 5 are 130 ns and 80 ns, respectively.

Further, in embodiment 1, the lower electrode 2 of Pt has an area of 10 μm×10 μm and a thickness of 0.1 μm. The first recording layer 3 of $Ge_8Sb_2Te_{11}$ has an area of 5 μm×5 μm and a thickness of 0.1 μm. The intermediate layer 4 of Pt has an area of 5 μm×5 μm and a thickness of 0.1 μm. The second recording layer 5 of $(Sb_{0.7}Te_{0.3})_{95}Ge_5$ has an area of 5 μm×5 μm and a thickness of 0.1 μm. The upper electrode 6 of Pt has an area of 5 μm×5 μm and a thickness of 0.1 μm. In this structure, the resistance value $R_{a1}$ of the first recording layer 3 in the amorphous phase and the resistance value $R_{a2}$ of the second recording layer 5 in the amorphous phase are 1000 Ω and 1500 Ω, respectively. The resistance value $R_{c1}$, of the first recording layer 3 in the crystalline phase and the resistance value $R_{c2}$ of the second recording layer 5 in the crystalline phase are 5 Ω and 10 Ω respectively.

The memory 11 has four different states shown in Table 1 below, State 1 to State 4. States 1–4 are represented by combinations of the phase states of the first recording layer 3 and the second recording layer 5 (amorphous phase and crystalline phase). Table 1 shows the phase states of the first recording layer 3 and the second recording layer 5 and the sum of the resistance values of the recording layers 3 and 5 for each of States 1–4 of the memory 11.

TABLE 1

| State of Memory 11 | 1st recording layer 3 | 2nd recording layer 5 | Sum of resistances |
|---|---|---|---|
| State 1 | Amorphous | Amorphous | $R_{a1} + R_{a2}$ (=2500 Ω) |
| State 2 | Crystal | Amorphous | $R_{o1} + R_{a2}$ (=1505 Ω) |
| State 3 | Amorphous | Crystal | $R_{a1} + R_{o2}$ (=1010 Ω) |
| State 4 | Crystal | Crystal | $R_{o1} + R_{o2}$ (=15 Ω) |

When the first recording layer 3 and the second recording layer 5 are both in the amorphous phase (State 1), the sum of the resistance of the first recording layer 3 and the resistance of the second recording layer 5 is $R_{a1}+R_{c2}$. When the first recording layer 3 is in the crystalline phase and the second recording layer 6, is in the amorphous phase (State 2), the sum of the resistance of the first recording layer 3 and the resistance of the second recording layer 5 is $R_{c1}+R_{a2}$. When the first recording layer 3 is in the amorphous phase and the second recording layer 5 is in the crystalline phase (State 3), the sum of the resistance of the first recording layer 3 and the resistance of the second recording layer 5 is $R_{a1}+R_{c2}$. When the first recording layer 3 and the second recording layer 5 are both in the crystalline phase (State 4), the sum of the resistance of the first recording layer 3 and the resistance of the second recording layer 5 is $R_{c1}+R_{c2}$. As described above, the sum of the resistances of the recording layers 3 and 5 is different among the States 1–4.

Next, a procedure for producing the memory 11 (steps S1101 to S1106) is described:

S1101: The substrate 1 is subjected to a surface treatment and then introduced into a sputtering apparatus.

S1102: A single metal target such as Al, Au, Ag, Cu, Pt, Ti, W, etc., or an alloy metal target of these metals is sputtered in an Ar gas atmosphere so as to form the lower electrode 2.

S1103: An alloy target including three elements, Ge, Sb, and Te, is sputtered in an atmosphere selected from a group consisting of an Ar gas atmosphere, a Kr gas atmosphere, a mixed gas atmosphere formed by Ar gas and reactive gas including at least one of oxygen gas and nitrogen gas, and a mixed gas atmosphere formed by Kr gas and reactive gas, so as to form the first recording layer 3 on the lower electrode 2.

S1104: A single metal target such as Al, Au, AS, Cu. Pt, Ti, W. etc., or an alloy metal target of these metals is sputtered in an Ar gas atmosphere so as to form the intermediate layer 4 on the first recording layer 3.

S1105: An alloy target including a material system represented by (Sb-Te)-Ml (where Ml is at least one selected from a group consisting of Ag, In, Ge, Sn, Se, Bi, Au, and Mn) is sputtered in an atmosphere selected from a group consisting of an Ar gas atmosphere, a Kr gas atmosphere, a mixed gas atmosphere formed by Ar gas and reactive gas including at least one of oxygen gas and nitrogen gas, and a mixed gas atmosphere formed by Kr gas and reactive gas, so as to form the second recording layer 5 on the intermediate layer 4.

S1106: A single metal target such as Al, Au, Ag, Cu, Pt, Ti, W, etc., or an alloy metal target of these metals is sputtered in an Ar gas atmosphere so as to form the upper electrode 6 on the second recording layer 5.

In the production steps S1101 to S1106, the sputtering apparatus is used to form the lower electrode 2, the first recording layer 3, the intermediate layer 4, the second recording layer 5, and the upper electrode 6. However, according to the present invention, any thin film forming apparatus can be used to form these layers. In embodiment 1, at step S1101, the surface of the Si substrate 1 is nitrided in a nitride atmosphere. In the thus-produced memory 11, an Au lead wire is bonded to each of the lower electrode 2 and the upper electrode 6. The Au lead wires are connected to the reading/writing apparatus 12 through the application sections 13.

Next, a method for writing information in the memory 11 and a method for erasing information from the memory 11 are described. When writing information in or erasing information from the memory 11, the switch 9 is closed and the switch 10 is opened. The pulse generator 7 generates an electric current pulse having an amplitude and width which are required to change the phase states of the first recording layer 3 and the second recording layer 5 to desired phase states. The electric current pulse generated by the pulse generator 7 is applied to the first recording layer 3 and the second recording layer 5 through the application sections 13.

Figure 2:
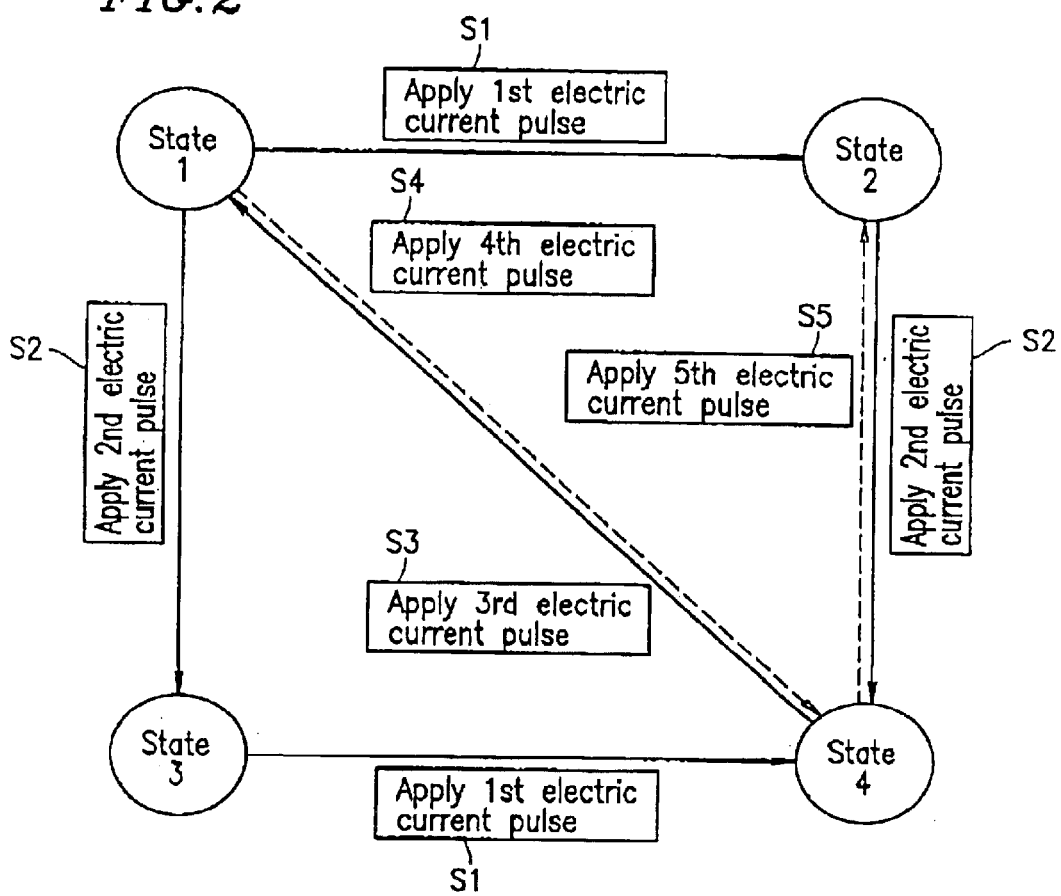
FIG. 2 illustrates transition of the state of the memory based on the phase states of first and second recording layers.

FIG. 2 illustrates the transition of the state of the memory 11 based on the phase states of the first recording layer 3 and the second recording layer 5.

In embodiment 1, referring to Table 1 in conjunction with FIG. 2, an operation which causes a transition from State 1 to State 2, an operation which causes a transition from State 1 to State 3, an operation which causes a transition from State 1 to State 4, an operation which causes a transition from State 2 to State 3, an operation which causes a transition from State 2 to State 4, an operation which causes a transition from State 3 to State 2, an operation which causes a transition from State 3 to State 4, an operation which causes a transition from State 4 to State 2, an operation which causes a transition from State 4 to State 3 are referred to as "write" operations. On the other hand, an operation which causes a transition from State 2 to State 1, an operation which causes a transition from State 3 to State 1, an operation which causes a transition from State 4 to State 1, are referred to as "erase" operations. The phase states of the first recording layer 3 and the second recording layer 5 are changed to desired phase states, whereby information can be written in the memory 11 or information can be erased from the memory 11.

Hereinafter, steps of writing information in and/or erasing information from the memory 11 are described with reference to FIG. 2:

Step S1: When State 1 is changed to State 2 or when State 3 is changed to State 4, i.e., when the first recording layer 3 is changed from the amorphous phase to the crystalline phase while the phase state of the second recording layer 5 is kept unchanged, the pulse generator 7 (FIG. 1) generates a first electric current pulse, which is applied to the first recording layer 3 and the second recording layer 5 through the application sections 13 (FIG. 1). The first electric current pulse provides a temperature (T) which satisfies $T_{x1} \leq T < T_{x2}$ during a time (t) which satisfies $t_{x1} < t$. Specific waveforms of the electric current pulse are described later with reference to FIG. 3.

Step S2: When State 1 is changed to State 3 or when State 2 is changed to State 4, i.e., when the phase state of the first recording layer 3 is kept unchanged while the second recording layer 5 is changed from the amorphous phase to the crystalline phase, the pulse generator 7 generates a second electric current pulse, which is applied to the first recording layer 3 and the second recording layer 5 through the application sections 13. The second electric current pulse provides a temperature (T) which satisfies $T_{x2} \leq T$ during a time (t) which Satisfies $t_{x2} \leq t < t_{x1}$.

Step S3: When State 4 is changed to State 1, i.e., when the first recording layer 3 and the second recording layer 5 are both changed from the crystalline phase to the amorphous phase, the pulse generator 7 generates a third electric current pulse, which is applied to the first recording layer 3 and the second recording layer 5 through the application sections 13. The third electric current pulse provides a temperature which is equal to or higher than the higher one of the melting points of the recording layers 3 and 5.

Step S4: When State 1 is changed to State 4, i.e., when the first recording layer 3 and the second recording layer 5 are both changed from the amorphous phase to the crystalline phase, the pulse generator 7 generates a fourth electric current pulse, which is applied to the first recording layer 3 and the second recording layer 5 through the application sections 13. The fourth electric current pulse provides a temperature (T) which satisfies $T_{x2} \leq T$ during time t which satisfies $t_{x1} \leq t$. It should be noted that Step S4 is not indispensable because Step S4 can be substituted by sequentially performing Step S1 and Step S2 or Step S2 and Step S1. Since Step S4 is not indispensable, a transition of the state of the memory 11 which corresponds to Step S4 is represented by a broken arrow in FIG. 2.

Step S5: When the melting point $T_{m1}$ of the first recording layer 3 and the melting point $T_{m2}$ of the second recording layer 5 have the relationship $T_{m1}>T_{m2}$, and State 4 is changed to State 2, i.e., when the phase state of the first recording layer 3 is kept at the crystalline phase while the second recording layer 5 is changed from the crystalline phase to the amorphous phase, the pulse generator 7 generates a fifth electric current pulse, which is applied to the first recording layer 3 and the second recording layer 5 through the application sections 13. The fifth electric current pulse provides a temperature (T) which satisfies $T_{m2} \leq T < T_{m1}$. It should be noted that Step S5 is not indispensable because Step S5 can be substituted by sequentially performing Step S3 and Step S1. Since Step S5 is not indispensable, a transition of the state of the memory 11 which corresponds to Step S5 is represented by a broken arrow in FIG. 2. Alternatively, when the melting point $T_{m1}$ of the first recording layer 3 and the melting point $T_{m2}$ of the second recording layer 5 have the relationship $T_{m1}<T_{m2}$, the fifth electric current pulse which provides a temperature (T) that satisfies $T_{m1} \leq T < T_{m2}$ is applied to the first recording layer 3 and the second recording layer 5, whereby a transition from State 4 to State 3 can be achieved.

With Steps S1 to S3, the phase states of the first recording layer 3 and the second recording layer 5 can be changed such that one of States 1–4 is changed to another. For example, when State 2 is changed to State 1, Step S2 and Step S3 are performed. When State 3 is changed to State 1, Step S1 and Step S3 are performed. When State 2 is changed to State 3, Step S2, Step S3, and then Step S2 are performed. When State 3 is changed to State 2, Step S1. Step S3, and then Step S1 are performed. When State 4 is changed to State 3, Step S3 and then Step S2 are performed.

When current phase states of the first recording layer 3 and the second recording layer 5 are known, the phase states of the recording layers 3 and 5 can be changed to desired phase states by a combination of the above steps. The current phase states (initial states) of the recording layers 3 and 5 can be identified by a reading method which will be described later with reference to FIG. 4. It should be noted that, by sequentially performing Step S2 and Step S1 or Step S1 and Step S2, the phase states of the recording layers 3 and 5 are changed such that the state of the memory 11 is changed from any state to State 4. Thus-achieved State 4 may be used as the initial state for changing the phase states of the recording layers 3 and 5 to desired phase states. With such an arrangement, the reading operation can be omitted because it is not necessary to identify the current phase states of the recording layers 3 and 5. However, the initial state of the memory 11 is not limited to State 4.

Next, the waveform of an electric current pulse which is used to change the phase states of the recording layers 3 and 5 is described.

Figure 3:
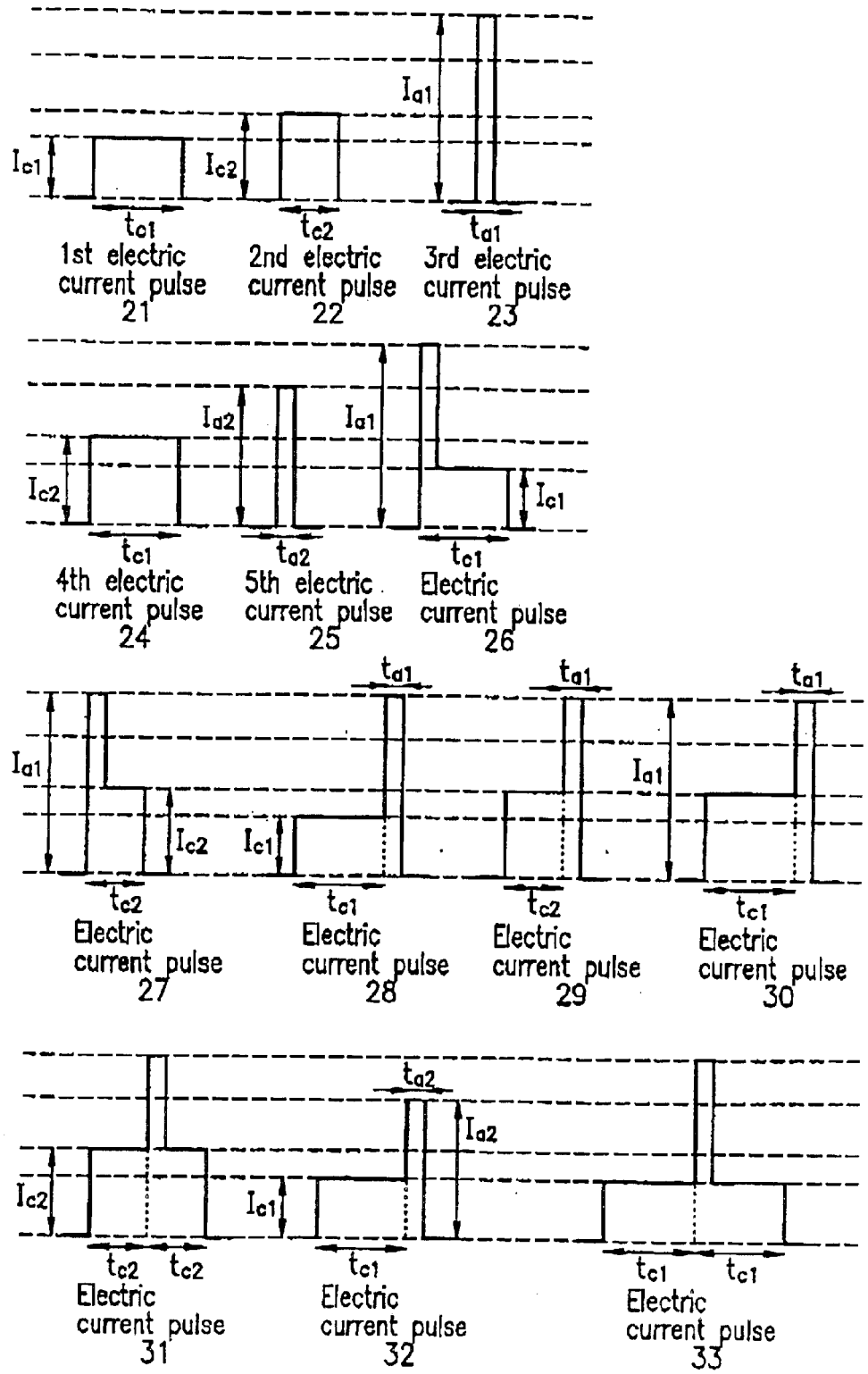
FIG. 3 shows the waveforms of electric current pulses employed to change the phase states of the two recording layers.

FIG. 3 shows the waveforms of electric current pulses employed to change the phase states of the two recording layers. The pulse generator 7 shown In FIG. 1 can generate electric current pulses having various pulse amplitudes (value of applied current) and various pulse widths (application time of current).

First electric current pulse 21

As described above with reference to FIG. 2, by applying the first electric current pulse 21 to the first recording layer 3 and the second recording layer 5, State 1 is changed to State 2 or State 3 is changed to State 4. When the first electric current pulse 21 is applied to the first recording layer 3 and the second recording layer 5, the temperature of both the recording layers 3 and 5 is increased to a temperature (T) which satisfies $T_{x1} \leq T < T_{x2}$ during a time (t) which satisfies $t_{x1} \leq t$. In embodiment 1, the pulse amplitude $I_{c1}$ and the pulse width $t_{c1}$ of the first electric current pulse 21 are set to 2 mA and 150 ns, respectively. According to the present invention, the pulse amplitude $I_{c1}$ is preferably $0.02 \leq I_{c1}$ (mA)$\leq 10$, and the pulse width $t_{c1}$ is preferably $5 \leq t_{c1}$(ns) $\leq 200$. When the first electric current pulse 21 is applied to the first recording layer 3 and the second recording layer 5, only in the first recording layer 3, the crystallization temperature ($T_{x1}$) and the crystallization time ($t_{x1}$) are achieved so that the first recording layer 3 changes from the amorphous phase to the crystalline phase, while a current phase state of the second recording layer 5 remains unchanged.

In this way, the first electric current pulse 21, which provides a temperature (T) that satisfies $T_{x1} \leq T < T_{x2}$ during a time (t) that satisfies $t_{x1} \leq t$, is applied to the first recording layer 3 and the second recording layer 5, whereby the first recording layer 3 is changed from the amorphous phase to the crystalline phase while the phase state of the second recording layer 5 is kept unchanged.

Second electric current pulse 22

As described above with reference to FIG. 2, by applying the second electric current pulse 22 to the first recording layer 3 and the second recording layer 5, State 1 is changed to State 3 or State 2 is changed to State 4. When the second electric current pulse 22 is applied to the first recording layer 3 and the second recording layer 5, the temperature of both the recording layers 3 and 5 is increased to a temperature (T) which satisfies $T_{x2} \leq T$ during a time (t) which satisfies $t_{x2} \leq t < t_{x1}$. In embodiment 1, the pulse amplitude $I_{c2}$ and the pulse width $t_{c2}$ of the second electric current pulse 22 are set to 4 mA and 100 ns, respectively. According to the present invention, the pulse amplitude $I_{c2}$ is preferably $0.05 \leq I_{c2}$ (mA)$\leq 20$, and the pulse width $t_{c2}$ is preferably $2 \leq t_{c2}$(ns) $\leq 150$. When the second electric current pulse 22 is applied to the first recording layer 3 and the second recording layer 5, only in the second recording layer 5, the crystallization temperature ($T_{x2}$) and the crystallization time ($t_{x2}$) are achieved so that a current phase state of the first recording layer 3 remains unchanged, while the second recording layer 5 changes from the amorphous phase to the crystalline phase.

In this way, the second electric current pulse 22, which provides a temperature (T) that satisfies $T_{x2} \leq T$ during a time (t) that satisfies $t_{x2} \leq t < t_{x1}$, is applied to the first recording layer 3 and the second recording layer 5, whereby the phase state of the first recording layer 3 is kept unchanged while the second recording layer 5 is changed from the amorphous phase to the crystalline phase.

Third electric current pulse 23

As described above with reference to FIG. 2, by applying the third electric current pulse 23 to the first recording layer 3 and the second recording layer 5, State 4 is changed to State 1. When the third electric current pulse 23 is applied to the first recording layer 3 and the second recording layer 5, the temperature of both the recording layers 3 and 5 is increased to a temperature (T) which is equal to or higher than the higher one of the melting points of the recording layers 3 and 5. In embodiment 1, the pulse amplitude $I_{a1}$ and the pulse width $t_{a1}$ of the third electric current pulse 23 are set to 50 mA and 50 ns, respectively. According to the present invention, the pulse amplitude $I_{a1}$ is preferably $0.1 \leq I_{a1}$(mA)$\leq 200$, and the pulse width $t_{a1}$ is preferably $1 \leq t_{a1}$(ns)$\leq 100$. When the third electric current pulse 23 is applied to the first recording layer 3 and the second recording layer 5, in each of the recording layers 3 and 5 the higher one of the melting points of the recording layers 3 and 5 (in embodiment 1, $T_{m1}=630°$ C.) is achieved or exceeded so that both the recording layers 3 and 5 are melted and then quenched, and as a result, both the recording layers 3 and 5 change from the crystalline phase to the amorphous phase. The pulse amplitude of the third electric current pulse 23, $I_{a1}$, is greater than the current values $I_{c1}$ and $I_{c2}$ which are required for changing the first recording layer 3 and the second recording layer 5 from the amorphous phase to the crystalline phase. This is in order to achieve a temperature higher than the crystallization temperatures $T_{x1}$ and $T_{x2}$ of the first recording layer 3 and the second recording layer 5 (i.e., $T_{m1}=630°$ C.).

In this way, the third electric current pulse 23, which provides a temperature equal to or higher than the higher one of the melting points of the recording layers 3 and 5, is applied to the first recording layer 3 and the second recording layer 5, whereby the first recording layer 3 and the second recording layer 5 are changed from the crystalline phase to the amorphous phase.

The first to third electric current pulses 21–23 are indispensable when writing information by using the writing/reading apparatus 12. By combinations of the first to third electric current pulses 21–23, the state of the memory 11 can be changed from any current state to any other state.

Fourth electric current pulse 24

As described above with reference to FIG. 2, by applying the fourth electric current pulse 24 to the first recording layer 3 and the second recording layer 5, State 1 is changed to State 4. When the fourth electric current pulse 24 is applied to the first recording layer 3 and the second recording layer 5, the temperature of both the recording layers 3 and 5 is increased to a temperature (T) which satisfies $T_{x2} \leq T$ during a time (t) which satisfies $t_{x1} \leq t$. The pulse amplitude of the fourth electric current pulse 24, $I_{c12}$, is equal to the pulse amplitude $I_{c2}$ of the second electric current pulse 22. The pulse width of the fourth electric current pulse 24, $t_{c12}$, is equal to the pulse width $t_{c1}$ of the first electric current pulse 21. In embodiment 1, the pulse amplitude $I_{c12}$ and the pulse width $t_{c12}$ of the fourth electric current pulse 24 are set to 4 mA (=$I_{c2}$) and 150 ns (=$t_{c1}$), respectively. According to the present invention, the pulse amplitude $I_{c12}$ is preferably $0.05 \leq I_{c12}$(mA)$\leq 20$, and the pulse width $t_{c12}$ is preferably $5 \leq t_{c12}$(ns)$\leq 200$. When the fourth electric current pulse 24 is applied to the first recording layer 3 and the second recording layer 5, in both the first recording layer 3 and the second recording layer 5, the crystallization temperature $T_{x2}$ and the crystallization time $t_{x1}$ are achieved so that both the first recording layer 3 and the second recording layer 5 changes from the amorphous phase to the crystalline phase.

In this way, the fourth electric current pulse 24, which provides a temperature (T) that satisfies $T_{x2} \leq T$ during a time (t) that satisfies $t_{x1} \leq t$, is applied to the first recording layer 3 and the second recording layer 5, whereby both the first recording layer 3 and the second recording layer 5 changes from the amorphous phase to the crystalline phase.

As described above, the fourth electric current pulse 24 is not indispensable because the fourth electric current pulse 24 can be substituted by application of the first electric current pulse 21 and the second electric current pulse 22. However, the fourth electric current pulse 24 can change the state of the memory 11 from State 1 to State 4 more quickly as compared with a case where the first electric current pulse 21 and the second electric current pulse 22 (or the second electric current pulse 22 and the first electric current pulse 21) are sequentially applied to the memory 11.

Fifth electric current pulse 25

As described above with reference to FIG. 2, by applying the fifth electric current pulse 25 to the first recording layer 3 and the second recording layer 5 where the melting point $T_{m1}$ of the first recording layer 3 and the melting point $T_{m2}$ of the second recording layer 5 have the relationship $T_{m1} > T_{m2}$. As State 4 is changed to State 2. When the fifth electric current pulse 25 is applied to the first recording layer 3 and the second recording layer 5, the temperature of both the recording layers 3 and 5 is increased to a temperature (T) which satisfies $T_{m2} \leq T < T_{m1}$. In embodiment 1, the pulse amplitude $I_{a2}$ and the pulse width $t_{a2}$ of the fifth electric current pulse 25 are set to 30 mA and 50 ns, respectively. According to the present invention, the pulse amplitude $I_{a2}$ is preferably $0.05 \leq I_{a2}$(mA)$\leq 160$, and the pulse width $t_{a2}$ is preferably $1 \leq t_{a2}$(ns)$\leq 100$. When the fifth electric current pulse 25 is applied to the first recording layer 3 and the second recording layer 5, in both the first recording layer 3 and the second recording layer 5, the melting point of the first recording layer 3 is not reached, but the melting point of the second recording layer 5 (in embodiment 1, $T_{m2}=550°$ C.) is reached or exceeded. Accordingly, the phase state of the first recording layer 3 is kept at the crystalline phase, while only the second recording layer 5 is melted and then quenched so as to change from the crystalline phase to the amorphous phase. It should be noted that in the case where the melting point $T_{m1}$, of the first recording layer 3 and the melting point $T_m$ of the second recording layer 5 have the relationship $T_{m1} < T_{m2}$, the fifth electric current pulse 25 is used to change State 4 to State 3.

In this way, in the case where the melting point $T_{m1}$ of the first recording layer 3 and the melting point $T_{m2}$ of the second recording layer 5 have the relationship $T_{m1} \neq T_{m2}$, the fifth electric current pulse 25, which provides a temperature that is equal to or higher than the lower one of the melting points $T_{m1}$ and $T_{m2}$ and that is lower than the higher one of the melting points $T_{m1}$ and $T_{m2}$ is applied to the first recording layer 3 and the second recording layer 5, whereby one of the first recording layer 3 and the second recording layer 5 which has the lower melting point is changed from the crystalline phase to the amorphous phase, while the phase state of the other recording layer having the higher melting point is kept at the crystalline phase.

As described above, the fifth electric current pulse 25 is useful when the melting point $T_{m1}$ of the first recording layer 3 is different from the melting point $T_{m2}$ of the second recording layer 5, but is not indispensable because the fifth electric current pulse 25 can be substituted by application of the third electric current pulse 23 and the first electric current pulse 21. However, the fifth electric current pulse 25 can change the state of the memory 11 from State 4 to State 2 or State 3 more quickly as compared with a case where the third electric current pulse 23 and the first electric current pulse 21 are sequentially applied to the memory 11.

Next, electric current pulses 26–33 which are formed by combining at least two of the first to fifth electric current pulses 21–25 are described with reference to FIG. 3 in conjunction with FIG. 2.

Electric current pulse 26

The electric current pulse 26 is formed by combining the third electric current pulse 23 and the first electric current pulse 21. The electric current pulse 26 can be used in place of the fifth electric current pulse 25 in order to change State 4 to State 2. By applying the electric current pulse 26 to the first recording layer 3 and the second recording layer 5, the temperature (T) of each of the recording layers 3 and 5 is increased so as to reach or exceed the higher one of the melting points of the recording layers 3 and 5, and accordingly, the first recording layer 3 and the second recording layer 5 are melted. Thereafter, the first recording layer 3 and the second recording layer 5 are quenched so that the temperature (T) of each of the recording layers 3 and 5 is decreased so as to satisfy $T_{x1} \leq T < T_{x2}$. The electric current pulse 26 is applied during a time (t) which satisfies $t_{x1} < t$. As shown in FIG. 3, the electric current pulse 26 first exhibits the amplitude $I_{a1}$ (in embodiment 1, $I_{a1}$=50 mA) and then the amplitude $I_{c1}$ (in embodiment 1, $I_{c1}$=2 mA). The electric current pulse 26 has a pulse width $t_{c1}$ in total (in embodiment 1, $t_{c1}$=150 ns).

As described above, the electric current pulse 26 is not indispensable because it can be substituted by the fifth electric current pulse 25. However, the electric current pulse 26 can change the state of the memory 11 from State 4 to State 2 even if the melting point of the first recording layer 3 is equal to that of the second recording layer 5, which cannot be achieved by the fifth electric current pulse 25.

When the electric current pulse 26, which first provides a temperature equal to or higher than the higher one of the melting points of the recording layers 3 and 5 and then a temperature (T) that satisfies $T_{x1} \leq T < T_{x2}$ during a time (t) that satisfies $t_{x1} \leq t$ in total, is applied to the first recording layer 3 and the second recording layer 5 the first recordinUg layer 3 and the second recording layer 5 are first changed from the crystalline phase to the amorphous phase, and then, the first recording layer 3 is changed from the amorphous phase to the crystalline phase while the second recording layer 5 is kept at the amorphous phase. That is, when the electric current pulse 26 is applied to the memory 11, the state of the memory 11 is changed from State 4 through State 1 to State 2.

Electric current pulse 27

The electric current pulse 27 is formed by combining the third electric current pulse 23 and the second electric current pulse 22. The electric current pulse 27 can be used to change State 4 to State 3. By applying the electric current pulse 27 to the first recording layer 3 and the second recording layer 5, the temperature (T) of each of the recording layers 3 and 5 is increased so as to reach or exceed the higher one of the melting points of the recording layers 3 and 5, and accordingly, the first recording layer 3 and the second recording layer 5 are melted. Thereafter the first recording layer 3 and the second recording layer 5 are quenched so that the temperature (T) of each of the recording layers 3 and 5 is decreased so as to satisfy $T_{x2} \leq T$. The electric current pulse 27 is applied during a time (t) which satisfies $t_{x2} \leq t < t_{x1}$. As shown in FIG. 3, the electric current pulse 27 first exhibits the amplitude $I_{a2}$ and then the amplitude $I_{c2}$ (in embodiment 1, $I_{c2}$=4 mA). The electric current pulse 27 has a pulse width $t_{c2}$ in total (in embodiment 1, $t_{c2}$=100 ns).

When the electric current pulse 27, which first provides a temperature equal to or higher than the higher one of the melting points of the recording layers 3 and 5 and then a temperature (T) that satisfies $T_{x2} \leq T$ during a time (t) that satisfies $t_{x2} \leq t < t_{x1}$ in total, is applied to the first recording layer 3 and the second recording layer 5, the first recording layer 3 and the second recording layer 5 are first changed from the crystalline phase to the amorphous phase, and then, the first recording layer 3 is kept at the amorphous phase while the second recording layer 5 is changed from the amorphous phase to the crystalline phases That is, when the electric current pulse 27 is applied to the memory 11, the state of the memory 11 is changed from State 4 through State 1 to State 3.

Electric current pulse 28

The electric current pulse 28 is formed by combining the first electric current pulse 21 and the third electric current pulse 23. The electric current pulse 28 can be used to change State 3 to State 1. By applying the electric current pulse 28 to the first recording layer 3 and the second recording layer 5, the temperature of both the recording layers 3 and 5 is increased to a temperature (T) which satisfies $T_{x1} \leq T < T_{x2}$ during a time (t) which satisfies $t_{x1} \leq t$ and then further increased so as to reach or exceed the higher one of the melting points of the recording layers 3 and 5. As shown in FIG. 3, the electric current pulse 28 first exhibits the amplitude $I_{c1}$ with the pulse width $t_{c1}$ and then the amplitude $I_{a1}$ with the pulse width $t_{a1}$ (in embodiment 1, $t_{a1}$=50 nS).

When the electric current pulse 28, which first provides a temperature (T) that satisfies $T_{x1} \leq T < T_{x2}$ during a time (t) that satisfies $t_{x1} \leq t$ and then provides a temperature equal to or higher than the higher one of the melting points of the recording layers 3 and 5, is applied to the first recording layer 3 and the second recording layer 5, the first recording layer 3 is changed from the amorphous phase to the crystalline phase while the second recording layer 5 is kept at the crystalline phase, and then, both the first recording layer 3 and the second recording layer 5 are changed from the crystalline phase to the amorphous phase. That is, when the electric current pulse 28 is applied to the memory 11, the state of the memory 11 is changed from State 3 through State 4 to state 1.

Electric current pulse 29

The electric current pulse 29 is formed by combining the second electric current pulse 22 and the third electric current pulse 23. The electric current pulse 29 can be used to change State 2 to State 1. By applying the electric current pulse 29 to the first recording layer 3 and the second recording layer 5, the temperature of both the recording layers 3 and 5 is increased to a temperature (T) which satisfies $T_{x2} \leq T$ during a time (t) which satisfies $t_{x2} \leq t < t_{x1}$ and then further increased so as to reach or exceed the higher one of the melting points of the recording layers 3 and 5. As shown in FIG. 3, the electric current pulse 29 first exhibits the amplitude $I_{c2}$ with the pulse width $t_{c2}$ and then the amplitude $I_{a1}$ with the pulse width $t_{a1}$.

When the electric current pulse 29, which first provides a temperature (T) which satisfies $T_{x2} \leq T$ during a time (t) which satisfies $t_{x2} \leq t < t_{x1}$ and then provides a temperature equal to or higher than the higher one of the melting points of the recording layers 3 and 5, is applied to the first recording layer 3 and the second recording layer 5, the first recording layer 3 is kept at the crystalline phase while the second recording layer 5 is changed from the amorphous phase to the crystalline phase, and then, both the first recording layer 3 and the second recording layer 5 are changed from the crystalline phase to the amorphous phase. That is, when the electric current pulse 29 is applied to the memory 11, the state of the memory 11 is changed from State 2 through State 4 to State 1.

Electric current pulse 30

The electric current pulse 30 is formed by combining the fourth electric current pulse 24 and the third electric current pulse 23. The electric current pulse 30 can be used to change State 2 or State 3 to State 1. The electric current pulse 30 can be used in place of the electric current pulse 28 or the electric current pulse 29. By applying the electric current pulse 30 to the first recording layer 3 and the second recording layer 5, the temperature of both the recording layers 3 and 5 is increased to temperature (T) which satisfies $T_{x2} \leq T$ during a time (t) which satisfies $t_{x1} \leq t$ and then further increased so as to reach or exceed the higher one of the melting points of the recording layers 3 and 5. As shown in FIG. 3, the electric current pulse 30 first exhibits the amplitude $I_{c2}$ with the pulse width $t_{c1}$ and then the amplitude $I_{a1}$ with the pulse width $t_{a1}$.

When the electric current pulse 30, which first provides a temperature (T) which satisfies $T_{x2} \leq T$ during a time (t) which satisfies $t_{x1} \leq t$ and then provides a temperature equal to or higher than the higher one of the melting points of the recording layers 3 and 5, is applied to the first recording layer 3 and the second recording layer 5, both the first recording layer 3 and the second recording layer 5 can be changed to the crystalline phase regardless of which phase (crystalline phase or amorphous phase) each of the recording layers 3 and 5 is in, and then, both the first recording layer 3 and the second recording layer 5 are changed from the crystalline phase to the amorphous phase. That is, when the electric current pulse 30 is applied to the memory 11, the state of the memory 11 is changed from State 2 or State 3 through State 4 to State 1.

Electric current pulse 31

The electric current pulse 31 is formed by combining the second electric current pulse 22 and the electric current pulse 27 (a combination of the third electric current pulse 23 and the second electric current pulse 22). The electric current pulse 31 can be used to change State 2 to State 3. By applying the electric current pulse 31 to the first recording layer 3 and the second recording layer 5, the temperature of both the recording layers 3 and 5 is increased to a temperature (T) which satisfies $T_{x2} \leq T$ during a time (t) which satisfies $t_{x2} \leq t < t_{x1}$. Thereafter, during a time (t) which satisfies $t_{x2} \leq t < t_{x1}$, the temperature of both the recording layers 3 and 5 is increased so as to reach or exceed the higher one of the melting points of the recording layers 3 and 5 so that the first recording layer 3 and the second recording layer 5 are melted; and then, the first recording layer 3 and the second recording layer 5 are quenched so that the temperature (T) of each of the recording layers 3 and 5 is decreased so as to satisfy $T_{x2} \leq T$. As shown in FIG. 3, the electric current pulse 31 first exhibits the amplitude $I_{c2}$ with the pulse width to $t_2$, and then exhibits the amplitude $I_{a1}$ plus the amplitude $I_{c2}$ with the pulse width $t_{c2}$.

When the electric current pulse 31, which first provides a temperature (T) which satisfies $T_{x2} \leq T$ during a time (t) which satisfies $t_{x2} \leq t < t_{x1}$, and thereafter, during a time (t) which satisfies $t_{x2} \leq t < t_{x1}$, provides a temperature equal to or higher than the higher one of the melting points of the recording layers 3 and 5 and then provides a temperature (T) which satisfies $T_{x2} \leq T$, is applied to the first recording layer 3 and the second recording layer 5, the first recording layer 3 is kept at the crystalline phase while the second recording layer 5 is changed from the amorphous phase to the crystalline phase, and then, both the first recording layer 3 and the second recording layer 5 can be changed from the crystalline phase to the amorphous phase, and thereafter, the first recording layer 3 is kept at the amorphous phase while the second recording layer 5 is changed from the amorphous phase to the crystalline phase. That is, when the electric current pulse 31 is applied to the memory 11, the state of the memory 11 is changed from State 2 through State 4 and State 1 to State 3.

Electric current pulse 32

The electric current pulse 32 is formed by combining the first electric current pulse 21 and the fifth electric current pulse 25. The electric current pulse 32 can be used to change State 3 to State 2. By applying the electric current pulse 32 to the first recording layer 3 and the second recording layer 5, the temperature of both the recording layers 3 and 5 is increased to a temperature (T) which satisfies $T_{x1} \leq T < T_{x2}$ during a time (t) which satisfies $t_{x1} \leq t$ and then further increased to a temperature $T_{m2}$. As shown in FIG. 3, the electric current pulse 28 first exhibits the amplitude $I_{c1}$ with the pulse width $t_{c1}$ and then the amplitude $I_{a2}$ (in embodiment 1, $I_{a2}$=30 mA) with the pulse width $t_{a2}$ (in embodiment 1, $t_{a2}$=50 ns).

When the electric current pulse 32, which first provides a temperature (T) that satisfies $T_{x1} \leq T < T_{x2}$ during a time (t) that satisfies $t_{x1} \leq t$ and then provides a temperature $T_{m2}$, is applied to the first recording layer 3 and the second recording layer 5, the first recording layer 3 is changed from the amorphous phase to the crystalline phase while the second recording layer 5 is kept at the crystalline phase, and then, the first recording layer 3 is kept at the crystalline phase while the second recording layer 5 is changed from the crystalline phase to the amorphous phase. That is, when the electric current pulse 32 is applied to the memory 11, the state of the memory 11 is changed from State 3 through State 4 to State 2.

Electric current pulse 33

The electric current pulse 33 is formed by combining the first electric current pulse 21 and the electric current pulse 26 (a combination of the third electric current pulse 23 and the first electric current pulse 21). The electric current pulse 33 can be used in place of the electric current pulse 32 to change State 3 to State 2. By applying the electric current pulse 33 to the first recording layer 3 and the second recording layer 5, the temperature of both the recording layers 3 and 5 is increased to a temperature (T) which satisfies $T_{x1} \leq T < T_{x2}$ during a time (t) which satisfies $t_{x1} \leq t$. Thereafter, during a time (t) which satisfies $t_{x1} \leq t$, the temperature of both the recording layers 3 and 5 is increased so as to reach or exceed the higher one of the melting points of the recording layers 3 and 5 and then, the first recording layer 3 and the second recording layer 5 are quenched so that the temperature (T) of each of the recording layers 3 and 5 is decreased so as to satisfy $T_{x1} \leq T < T_{x2}$. As shown in FIG. 3, the electric current pulse 33 first exhibits the amplitude $I_{c1}$, with the pulse width $t_{c1}$, and then exhibits the amplitude $I_{a1}$ plus the amplitude $I_{c1}$ with the pulse width $t_{c1}$.

When the electric current pulse 33, which first provides a temperature (T) which satisfies $T_{x1} \leq T < T_{x2}$ during a time (t) which satisfies $t_{x1} \leq t$, and then, during a time (t) which satisfies $t_{x1} \leq t$, provides a temperature equal to or higher than the higher one of the melting points of the recording layers 3 and 5 and thereafter provides a temperature (T) which satisfies $T_{x1} \leq T < T_{x2}$, is applied to the first recording layer 3 and the second recording layer 5, the first recording layer 3 is changed from the amorphous phase to the crystalline phase while the second recording layer 5 is kept at the crystalline phase, and then, both the first recording layer 3 and the second recording layer 5 are changed from the crystalline phase to the amorphous phase, and thereafter, the first recording layer 3 is changed from the amorphous phase to the crystalline phase while the second recording layer 5 is kept at the amorphous phase. That is, when the electric current pulse 33 is applied to the memory 11, the state of the memory 11 is changed from State 3 through State 4 and State 1 to State 2.

When one of the electric current pulses 28–33 is applied to the memory 11, the state of the memory always changes to State 4 for a while before it finally reaches a desired state. Such an arrangement is adopted because, when one of the first recording layer 3 and the second recording layer 5 is in the amorphous phase (high resistive state), a large part of electric energy of an applied electric current pulse is consumed by the amorphous-phase recording layer, and in such a case, it is impossible to apply to the other crystalline phase recording layer electric energy such that the phase state of only the crystalline phase recording layer (low resistive state) can be changed to the amorphous phase. Thus, the electric current pulses 28–33 are designed such that the phase states of the both recording layers are first changed to the crystalline phase, and then changed to the amorphous phase.

The writing/reading apparatus 12 (FIG. 1) of the present invention uses three types of electric current pulses and combinations thereof to control the phase states of the first recording layer 3 and the second recording layer 5 between the crystalline phase and the amorphous phase such that the phase state of each of the recording layers 3 and 5 is changed from any phase state to a desired phase state.

Next, a method for reading information from the memory 11 is described with reference to FIG. 1. When information is read from the memory 11, the switch 10 is closed so that the writing/reading apparatus 12 is connected to the memory 11 through the application sections 13. The resistance measurement section a applies an electric current pulse $I_r$ to the first recording layer 3 and the second recording layer 5 and detects the resistance value of the recording layers 3 and 5 (the sum of the resistance value of the first recording layer 3 and the resistance value of the second recording layer 5) based on a potential difference caused between the lower electrode 2 and the upper electrode 6. The electric current pulse $I_r$ may be generated by the pulse generator 7 in place of the resistance measurement section 8. In this case, the switch 9 is closed. The electric current pulse $I_r$ has an amplitude and pulse width having a size such that a phase change is not caused in the first recording layer 3 and the second recording layer 5. The electric current pulse $I_r$ is preferably $I_r(mA) \leq 0.02$.

Figure 4:
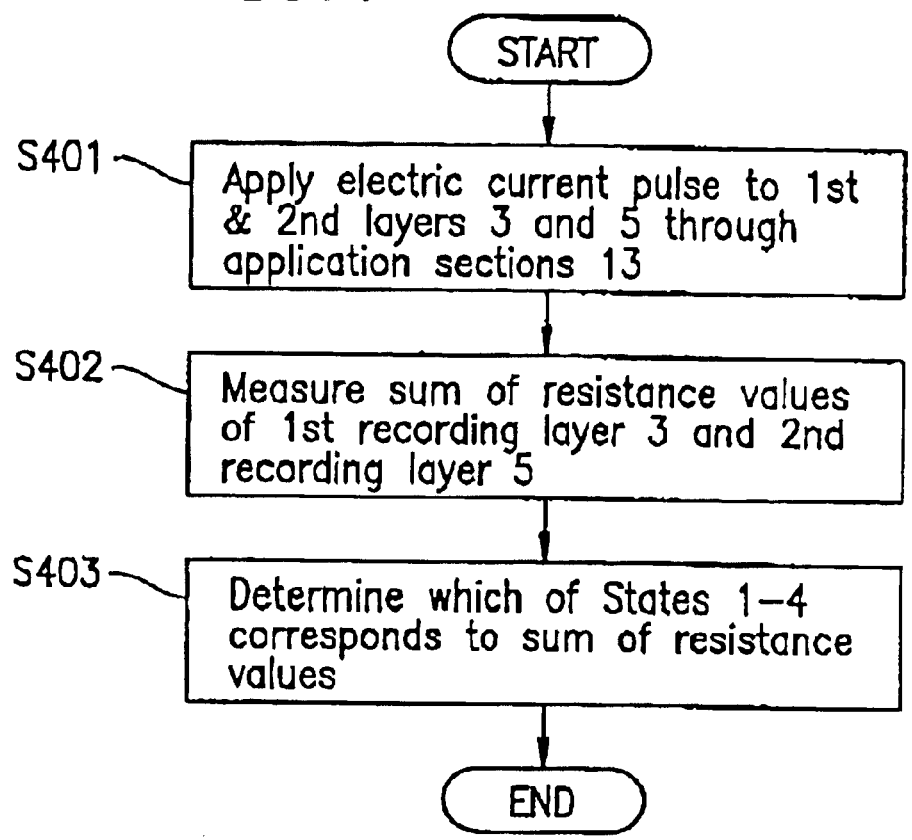
FIG. 4 is a flowchart illustrating the method for reading information from the memory by using the writing/reading apparatus of the present invention.

FIG. 4 is a flowchart illustrating the method for reading information from the memory 11 by using the writing/reading apparatus 2 of the present invention. Hereinafter, steps of the method for reading information from the memory 11 are described with reference to FIG. 4 in conjunction with FIG. 1:

Step S401: The electric current pulse $I_r$ is applied to the first recording layer 3 and the second recording layer 5 through the application sections 13.

Step S402: The resistance measurement section 8 measures the sum of the resistance values of the first recording layer 3 and the second recording layer 5.

Step S403: The determination section 16 determines which of States 1–4 the measured sum of the resistance values corresponds to.

Through these steps, information is read from the memory 11.

In the examples illustrated in FIGS. 2 and 4, the writing/reading apparatus 12 has both the writing function and the reading function However, according to the present invention, the apparatus 12 may have only one of the writing (and erasing) function and the reading function. In the case where the apparatus 12 performs only a writing (and erasing) operation, the resistance measurement section 8 and the determination section 16 may be omitted from the apparatus 12. In this cases the apparatus 12 is an apparatus for writing information in (or erasing information from) the memory 11. In the case where the apparatus 12 performs only a reading operation, the pulse generator 7 may be omitted from the apparatus 12. Furthermore, the switches 9 and 10 for switching between the writing (and erasing) function and the reading function may be manually operated. Alternatively, a control section for controlling the switches 9 and 10 based on a command externally supplied from the outside of the apparatus 12 may be provided.

In the example illustrated in FIG. 1, only a single memory 11 is employed. However, a memory structure including a plurality of memories 11 arranged in a matrix is within the scope of the present invention.

Figure 5:
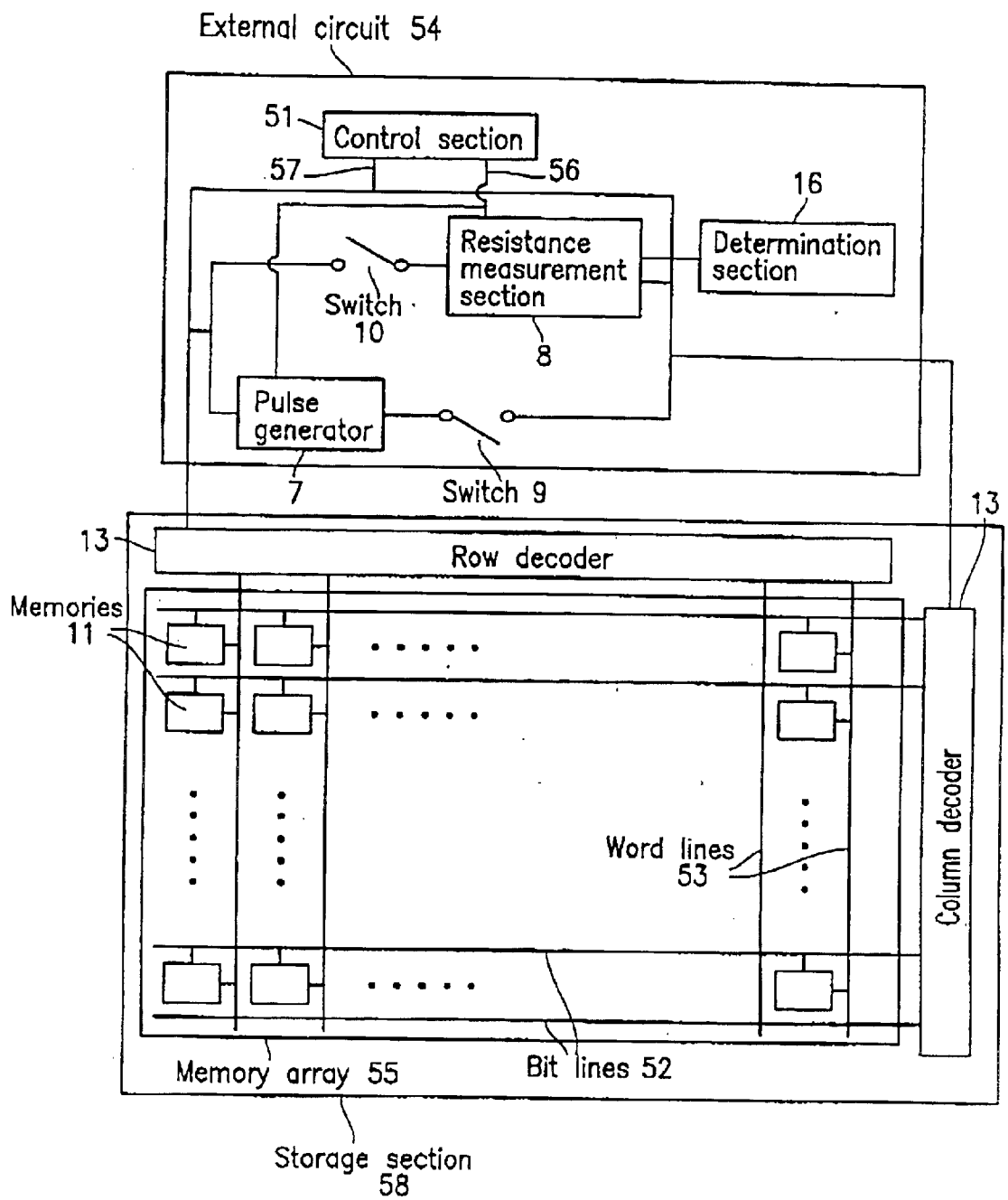
FIG. 5 shows an exemplary structure formed by a storage device including a plurality of memories of the present Invention arranged in a matrix and an external circuit connected to the storage device.

FIG. 5 shows an exemplary structure formed by a storage device including a plurality of memories of the present invention arranged in a matrix and an external circuit connected to the storage device. Like elements are indicated by like reference numerals used in FIG. 1, and detailed descriptions thereof are omitted.

The external circuit 54 includes a pulse generator 7, a resistance measurement section 8, switches 9 and 10, a determination section 16, and a control section 51. The storage section 58 includes application sections 13 having a row decoder and a column decoder, bit lines 52, word lines 53, and a memory array 55 formed by a plurality of memories 11.

The control section 51 supplies control information indicating which of a writing operation and a reading operation is to be performed, such as a command or the like, to the pulse generator 7 and the resistance measurement section 8 through a line 56. Based on the control information received from the control section 51, the pulse generator 7 and the resistance measurement section 8 open or close the switches 9 and 10 respectively, so as to perform a writing operation or a reading operation. Furthermore, the control section 51 supplies to the application sections 13 through a line 57 address information indicating which memory 11 in the memory array 55 an electric current pulse is to be applied.

The row decoder and the column decoder of the application sections 13 respectively select a word line 53 and a bit line 52 corresponding to a memory 11 designated by the received address information. Then, an electric current pulse is applied to the designated memory 11 so as to write information In or read information from the designated memory 11.

A plurality of memories 11 each having a structure shown in FIG. 1 may be arranged in a matrix as shown in FIG. 5, whereby the capacity of the storage device can be increased.

EMBODIMENT 2

In embodiment 1, the memory 11 includes two recording layers. However, according to the present invention, the number of the recording layers included in a single memory is not limited to 2. In embodiment 2, a memory including N recording layers (N is a natural number greater than 2 (N>2)) is described.

Figure 6:
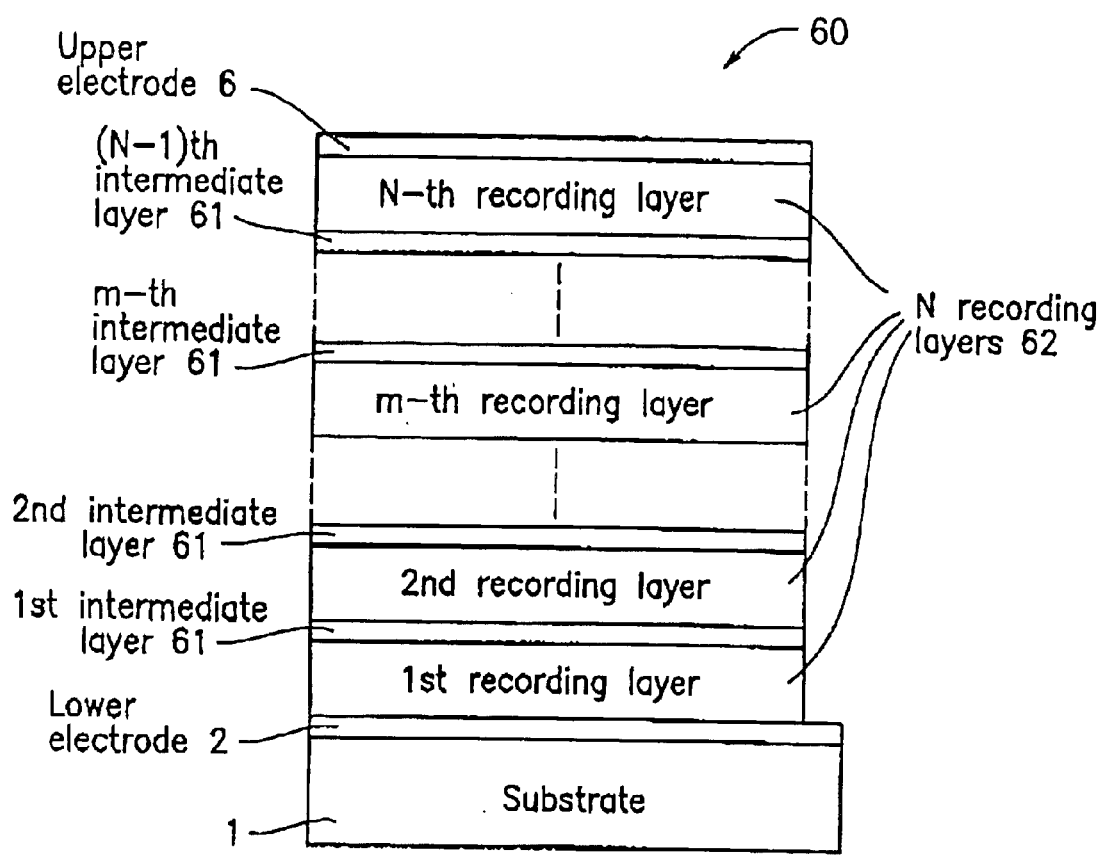
FIG. 6 shows a memory including N recording layers.

FIG. 6 shows a memory 60 including N recording layers 62. Like elements are indicated by like reference numerals used in FIG. 1 and detailed descriptions thereof are omitted. The memory 60 includes a substrate 1, 1st to (N−1)th intermediate layers 61, the N recording layers 62, and an upper electrode 6.

The 1st to (N−1)th intermediate layers 61 are provided for the same reason as for the intermediate layer 4 of FIG. 1, i.e., provided for preventing atoms which constitute one of the N recording layers 62 from being diffusively moving therebetween. Preferably, the $1^{st}$ to (N−1)th intermediate layers 61 are electrically conductive, and are made of a single metal material, such as Al, Au, Ag, Cu, Pt, Ti, W, etc., or a combination thereof (alloy material). However, the material of the intermediate layers 61 is not limited to these materials.

It should be noted that any structure for applying an electric current pulse to the N recording layers 62 can be employed in place of the lower electrode 2 and/or the upper electrode 6. For example, if the substrate 1 is electrically conductive, the lower electrode 2 can be omitted. Furthermore, the intermediate layer 4 may be omitted when the N recording layers 62 are made of such a material that atoms constituting the N recording layers 62 do not diffusively move therebetween.

The N recording layers 62 are made of such a material that a reversible phase change between the crystalline phase and the amorphous phase is caused by increases in temperature due to application of electric energy such as an electric pulse or the like. The material of N recording layers 62 is selected such that the following conditions 1–3 are satisfied:

Condition 1: The crystallization temperature of the m-th recording layer (1≦m ≦N) among the N recording layers 62, $T_{xm}$, satisfies the relationship $T_{x1}<T_{x2}< \ldots <T_{xm-1}<T_{xm}<T_{xm+}< \ldots <T_{xN}$.

Condition 2: The crystallization time of the m-th recording layer (1≦m ≦N) among the N recording layers 62, $t_{xm}$, satisfies the relationship $t_{x1}>t_{x2}> \ldots >t_{xm-1}>t_{xm}>t_{xm+}> \ldots >t_{xN}$.

Condition 3: The resistance values of the N recording layers in the amorphous phase are different from one another, the resistance values of the N recording layers in the crystalline phase are different from one another, and the sum of the resistance values of the N recording layers is one of $2^N$ values.

By satisfying Condition 1 and Condition 2, the phase state of each of the N recording layers 62 can be set to a desired state (amorphous phase or crystalline phase). Moreover, by satisfying Condition 3, $2^N$ states represented by combinations of the phase states of the N recording layers 62 can be distinguishably detected, Thus, the N recording layers 62 of the memory 60 can store $2^N$-value information (N bits) corresponding to the $2^N$ states. In this structure, the phase state of each recording layer is controlled between the crystalline phase and the amorphous phase. This is easier than a stepwise control of the phase state of a single recording layer.

The memory 60 having such a structure can be used in place of the memory 11 shown in FIG. 1. The writing/reading apparatus 12 shown in FIG. 1 can be used to write information in or read information from the memory 60.

In the memory 60 having the above structure, each of the N recording layers 62 is in any one of the amorphous phase and the crystalline phase, whereby the state of the memory 60 can be one of the $2^N$ states which are expressed by combinations of the phase states of the N recording layers 62. In embodiment 2, "State 1" means a state where all of the N recording layers 62 are in the amorphous phase. "State $2^N$" means a state where all of the N recording layers 62 are in the crystalline phase. An operation which causes a transition from State 1 to any one of State 2 to State $2^N$ is referred to as a "write" operation. On the other hand, an operation which causes a transition from any one of State 2 to State $2^N$ to State 1 is referred to as "erase" operations. The phase states of each of the N recording layers 62 is changed to desired phase states, whereby information can be written in the memory 60 or information can be erased from the memory, 60.

Next, a method for writing information in the memory 60 and a method for erasing information from the memory 60 are described with reference to the writing/reading apparatus 12 shown in FIG. 1 (assuming that the memory 11 shown in FIG. 1 is substituted by the memory 60 of FIG. 6).

When writing information in or erasing information from the memory 60, the switch 9 is closed and the switch 10 is opened. The pulse generator 7 generates an electric current pulse having an amplitude and width which are required to change the phase states of the N recording layers 62 to desired phase states. The electric current pulse generated by the pulse generator 7 is applied to the N recording layers 62 of the memory 60 through the application sections 13.

FIG. 7 shows the waveforms of electric current pulses employed to change the phase states of the N recording layers 62.

Electric current pulse (crystallization pulse) 70

The crystallization pulse 70 is employed in order to change only the m-th recording layer (1≦m ≦N) from the amorphous phase to the crystalline phase. The crystallization pulse 70 is provided for each of the N recording layers 62. When the crystallization pulse 70 is applied to the N recording layers 62, the temperature of all the N recording layers 62 is increased to a temperature ($T_x$) which satisfies $T_{xm} \leq T_x<T_{x,(m+1)}$ during a time ($t_x$) which satisfies $t_{xm} \leq t_x<t_{x(m+1)}$. By applying the crystallization pulse 70 having an amplitude $I_{cm}$ and pulse width $t_{cm}$ to the N recording layers 62, only in the m-th recording layer, the crystallization temperature ($T_{xm}$) and the crystallization time ($t_{xm}$) are achieved so that only the m-th recording layer changes from the amorphous phase to the crystalline phase.

Thus, by applying the crystallization pulse 70, which provides a temperature ($T_x$) that satisfies $T_{xm} \leq T_x<T_{x(m+1)}$ during a time ($t_x$) that satisfies $t_{xm} \leq t_x<t_{x(m-1)}$, to the N recording layers 62 through the application sections 13, only the m-th recording layer is changed from the amorphous phase to the crystalline phase while the phase states of the other recording layers are kept unchanged. It should be noted that when m=1, the above relationship $t_{xm} \leq t_x<t_{x(m-1)}$ can be expressed as $t_{x1} \leq t_x$. When m=N, the above relationship $T_{xm} \leq T_x<T_{x(m+1)}$ can be expressed as $T_{xN} \leq T_x$.

Electric current pulse (amorphization pulse) 71:

The amorphization pulse 71 is employed in order to change the state of the memory 60 from State $2^N$ to State 1. When the amorphization pulse 71 is applied to the N recording layers 62, the temperature of all the N recording layers 62 is increased to a temperature equal to or higher than the highest one of the melting points of the N recording layers 62. By applying such an amorphization pulse 71 having an amplitude $I_{aN+1}$ and pulse width $t_{aN+1}$ to the N recording layers 62, all of the N recording layers 62 reach or exceed their melting points to be melted, and thereafter, all of the N recording layers 62 are quenched, whereby all of the N recording layers 62 are changed from the crystalline phase to the amorphous phase.

Thus, by applying the amorphization pulse 71, which provides a temperature equal to or higher than the highest one of the melting points of the N recording layers 62, to the N recording layers 62 through the application sections 13, all of the N recording layers 62 can be changed from the crystalline phase to the amorphous phase.

By sequentially applying the crystallization pulses 70 for respective amorphous-phase recording layers among the N recording layers 62 to the memory 60, any current state of the memory 60 can be changed to State $2^N$. Alternatively, by applying the amorphization pulse 71 to the memory 60 which is in State $2^N$, the memory 60 can be changed from State $2^N$ to State 1. Alternatively, when the memory 60 is in State 1, by sequentially applying to the memory 60 the crystallization pulses for one or more amorphous-phase recording layers among the N recording layers 62 which are desired to be changed from the amorphous phase to the crystalline phase, the memory 60 can be changed from State 1 to any desired state. By using the crystallization pulses 70, the amorphization pulse 71, or combinations thereof, the state of the memory 60 can be changed from any one of $2^N$ states to another.

Electric current pulse 72

The electric current pulse 72 is employed in order to change the m-th to (m+n−1)th recording layers ($1 \leq m \leq N$) among the N recording layers 62 from the amorphous phase to the crystalline phase. When the electric current pulse 72 is applied to the N recording layers 62 through the application sections 13, the temperature of all the N recording layers 62 is increased to a temperature ($T_x$) which satisfies $T_{x(M+n-1)} \leq T_x < T_{x(m+n)}$ during a time ($t_x$) which satisfies $t_{xm} \leq t_x < t_{x(m-1)}$. By applying the electric current pulse 72 having an amplitude $I_{c(m+n-1)}$ and pulse width $t_{cm}$ to the N recording layers 62, in each of the m-th to (m+n−1)th recording layers, the crystallization temperature ($T_{x(m+n-1)}$) and the crystallization time ($t_{xm}$) are achieved so that all of the m-th to (m+n−1)th recording layers change from the amorphous phase to the crystalline phase.

Thus, by applying the electric current pulse 72, which provides a temperature ($T_x$) that satisfies $t_{x(m+n-1)} \leq T_x < T_{x(m+n)}$ during a time ($t_x$) that satisfies $t_{xm} \leq t_x < t_{x(m-1)}$, to the N recording layers 62 through the application sections 13, all of the m-th to (m+n−1)th recording layers among the N recording layers 62 can be changed from the amorphous phase to the crystalline phase.

The electric current pulse 72 is not indispensable because the m-th to (m+n−1)th recording layers can be changed from the amorphous phase to the crystalline phase by sequentially applying to the memory 60 the crystallization pulses 70 corresponding to the m-th to (m+n−1)th recording layers. However, the electric current pulse 72 can change the m-th to (m+n−1)th recording layers from the amorphous phase to the crystalline phase more quickly as compared with a case where the crystallization pulses 70 corresponding to the m-th to (m+n−1)th recording layers are sequentially applied to the memory 60.

Electric current pulse 73

The electric current pulse 73 is employed in order to change the state of the memory 60 from State 1 to State $2^N$. When the electric current pulse 73 is applied to the N recording layers 62, the temperature of all the N recording layers 62 is increased to a temperature ($T_x$) which satisfies $T_{xN} \leq T_x$ during a time ($t_x$) which satisfies $t_{x1} \leq t_x$. By applying the electric current pulse 73 having an amplitude $I_{cN}$ and pulse width $t_{c1}$ to the N recording layers 62, in all of the N recording layers 62, the crystallization temperature ($T_{xN}$) and the crystallization time ($t_{x1}$) are achieved so that all of the N recording layers 62 change from the amorphous phase to the crystalline phase.

Thus, by applying the electric current pulse 73, which provides a temperature ($T_x$) that satisfies $T_{xn} \leq T_x$ during a time ($t_x$) that satisfies $t_{x1} \leq t_x$, to the N recording layers 62 through the application sections 13, all of the N recording layers 62 can be changed from the amorphous phase to the crystalline phase.

The electric current pulse 73 is not indispensable because all of the N recording layers 62 can be changed from the amorphous phase to the crystalline phase by sequentially applying to the memory 60 the crystallization pulses 70. However, the electric current pulse 73 can change the state of the memory 60 from State 1 to State $2^N$ more quickly as compared with a case where the crystallization pulses 70 are sequentially applied to the memory 60.

Electric current pulse 74

The electric current pulse 74 is formed by combining the electric current pulse 73 and the amorphization pulse 71. The electric current pulse 74 is employed when at least one recording layer among the N recording layers 62 is in the amorphous phase, in order to change the state of the memory 60 to State 1. By applying the electric current pulse 74 to the N recording layers 62, the temperature (T) of all the N recording layers 62 is increased to a temperature ($T_x$) which satisfies $T_x \leq T_{xN}$ during a time ($t_x$) which satisfies $t_{x1} \leq t_x$ and then further increased so as to reach the highest one of the melting points of the N recording layers 62. By applying to the N recording layers 62 the electric current pulse 74 which first exhibits the amplitude $I_{cN}$ with the pulse width $t_{c1}$ and then the amplitude $I_{aN+1}$ with the pulse width $t_{aN+1}$, in all of the N recording layers 62, the crystallization temperature ($T_{xN}$) and the crystallization time ($t_{x1}$) are achieved so that all of the N recording layers 62 change from the amorphous phase to the crystalline phase, and then, all of the N recording layers 62 reach or exceed the highest one of the melting points of the N recording layers 62 so that all of the N recording layers 62 are melted. Thereafter, all of the N recording layers 62 are quenched, whereby all of the N recording layers 62 are changed from the crystalline phase to the amorphous phase.

The electric current pulse 74 is not indispensable because all of the N recording layers 62 can be changed to the crystalline phase (State $2^N$) by sequentially applying the crystallization pulses 70 to the memory 60, and then, the state of the memory 60 can be changed from State $2^N$ to State 1 by applying the amorphization pulse 71 to the memory 60. However, the electric current pulse 74 can change the state of the memory 60 from any state except for State $2^N$ to State 1 more quickly as compared with a case where the crystallization pulses 70 for the first to Nth recording layers and the amorphization pulse 71 are sequentially applied to the memory 60.

Electric current pulse 75

The electric current pulse 75 is employed in the case where each of one or more recording layers among the N recording layers 62 has a melting point equal to or lower than a temperature $T_m$, and each of the other recording layers among the N recording layers 62 has a melting point higher than a temperature $T_m$, in order to change the one or more recording layers from the crystalline phase to the amorphous phase while the other recording layer are kept at the crystalline phase. By applying the electric current pulse 75 to the N recording layers 62, the temperature (T) of all the N recording layers 62 is increased so that each of the one or more recording layers reaches the temperature $T_m$. By applying to the N recording layers 62 the electric current pulse 75 having the amplitude $I_{am}$ and the pulse width $t_{am}$ each of the one or more recording layers which have melting points equal to or lower than the temperature $T_m$ reaches the temperature $T_m$ so as to change from the crystalline phase to the amorphous phase.

The temperature $T_m$ may be any temperature which is equal to or higher than the lowest one of the melting points of the N recording layers 62 and lower than the highest one of the melting points of the N recording layers 62. By determining the temperature $T_m$, the N recording layers 62 can be divided into a group consisting of one or more recording layers each of which has a melting point equal to or lower than the temperature $T_m$ and a group consisting of the other recording layers each of which has a melting point higher than the temperature $T_m$. By applying to the N recording layers 62 the electric current pulse 75 which provides the temperature $T_m$, each of the recording layers having a melting point equal to or lower than the temperature $T_m$ can be changed from the crystalline phase to the amorphous phase.

The electric current pulse 75 is useful when the melting points of the N recording layers 62 are different, but not indispensable because only a desired recording layer(s) among the N recording layers 62 can be changed to the crystalline phase by sequentially applying the amorphization pulse 71 and the crystallization pulses 70 to the memory 60 in place of the electric current pulse 75. However, the electric current pulse 75 can change only a desired recording layer(s) among the N recording layers 62 to the crystalline phase more quickly as compared with a case where the amorphization pulse 71 and the crystallization pulses 70 are sequentially applied to the memory 60.

When current phase states of the N recording layers 62 are known, the phase states of the N recording layers 62 can be changed to desired phase states by a combination of the crystallization pulses 70 and the amorphization pulse 71. The current phase states (initial states) of the N recording layers 62 can be identified by a reading method which will be described later with reference to FIG. 8. It should be noted that, by sequentially applying to the memory 60 the crystallization pulses 70 corresponding to the respective one of the first to Nth recording layers (or by applying the electric current pulse 73 to the memory 60), the state of the memory 60 is changed from any state to State $2^N$. Thus-achieved State $2^N$ may be used as the initial state for changing the phase states of the N recording layers 62 to desired phase states. With such an arrangement, the reading operation can be omitted because it is not necessary to identify the current phase states of the N recording layers 62. However, the initial state of the memory 60 is not limited to State $2^N$.

Next, a method for reading information from the memory 60 is described with reference to the writing/reading apparatus 12 of FIG. 1 (assuming that the memory 11 shown in FIG. 1 is substituted by the memory 60 of FIG. 6). The reading method of embodiment 2 is substantially the same as that of embodiment 1 which has been described with reference to FIG. 4. When information is read from the memory 60, the switch 10 is closed so that the writing/reading apparatus 12 is connected to the memory 60 through the application sections 13. The resistance measurement section 8 applies an electric current pulse $I_r$ to the N recording layers 62 and detects the resistance value of the N recording layers 62 (the sum of the resistance values of each of the N recording layers 62) based on a potential difference caused between the lower electrode 2 and the upper electrode 6. The electric current pulse $I_r$ has an amplitude and pulse width having a size such that a phase change is not caused in the N recording layers 62.

Figure 8:
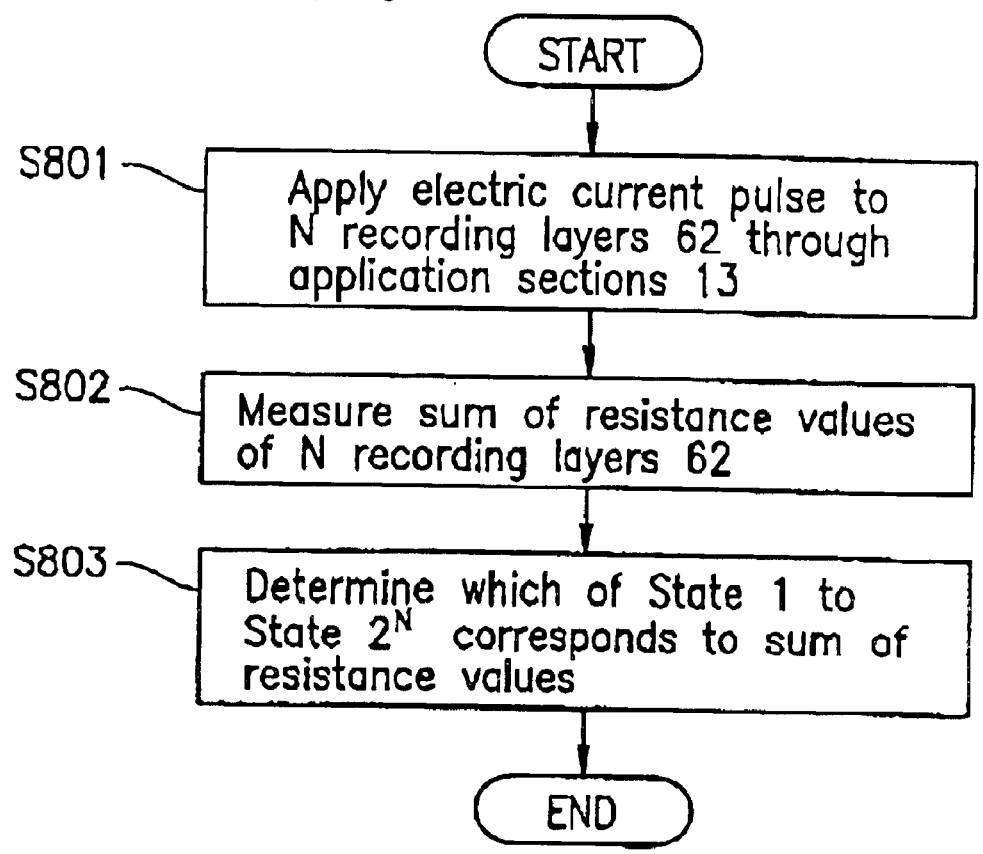
FIG. 8 is a flowchart illustrating the method for reading information from the memory by using the writing/reading apparatus of the present invention.

FIG. 8 is a flowchart illustrating the method for reading information from the memory 60 by using the writing/reading apparatus 12 of the present invention. Hereinafter, steps of the method for reading information from the memory 60 are described with reference to FIG. 8 in conjunction with FIG. 1:

Step S801: The electric current pulse $I_r$ is applied to the N recording layers 62 through the application sections 13.

Step S802: The resistance measurement section 8 measures the sum of the resistance values of the N recording layers 62.

Step S803: The determination section 16 determines which of States $1-2^N$ the measured sum of the resistance values corresponds to.

Through these steps, information is read from the memory 60.

It should be noted that a plurality of memories 60 each having a structure shown in FIG. 6 may be arranged in a matrix as shown in FIG. 5, whereby the capacity of a storage device can be increased.

In the memory 60 of FIG. 6, the recording layers 62 are formed in the order from the first recording layer to the Nth recording layer. However, the first to Nth recording layers may be formed in any other order (e.g., in a random order).

A memory of the present invention includes a first recording layer and a second recording layer each of which records information by utilizing a reversible phase change between a crystalline phase and an amorphous phase which may occur due to increases in temperature caused by the application of the electric current pulse. The crystallization temperature of the first recording layer, $T_{x1}$, and the crystallization temperature of the second recording layer, $T_{x2}$, have the relationship $T_{x1}<T_{x2}$, and the crystallization time of the first recording layer, $t_{x1}$, and the crystallization time of the second recording layer, $t_{x2}$, have the relationship $t_{x1}>t_{x2}$, such that each of the first and second recording layers can be set at a desired phase state (amorphous phase or crystalline phase). Furthermore, where the resistance value of the first recording layer in the amorphous phase is $R_{a1}$, the resistance value of the first recording layer in the crystalline phase is $R_{c1}$, the resistance value of the second recording layer in the amorphous phase is $R_{a2}$, and the resistance value of the second recording layer in the crystalline phase is $R_{c1}$, $R_{a1}+R_{a2}$, $R_{a1}+R_{c2}$, $R_{c1}+R_{a2}$, and $R_{c1}+R_{c2}$ are different from one another. Thus, four states of the memory represented by combinations of the phase state of the first recording layer and the phase state of the second recording layer can be distinguishably detected. In this structure, the phase state of each recording layer is controlled between the crystalline phase and the amorphous phase. This is easier than a stepwise control of the phase state of a single recording layer. The number of recording layers is not limited to 2. The same effects of the present invention can be obtained even with a memory including more than two recording layers.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A memory, comprising:
   a first recording layer for recording information by utilizing a reversible phase change between a crystalline phase and an amorphous phase which occurs due to increases in temperature caused by application of an electric current pulse; and
   a second recording layer for recording information by utilizing a reversible phase change between a crystalline phase and an amorphous phase which occurs due to increases in temperature caused by application of an electric current pulse,
   wherein the crystallization temperature of the first recording layer, $T_{x1}$, and the crystallization temperature of the second recording layer, $T_{x2}$, have the relationship $T_{x1} < T_{x2}$,
   the crystallization time of the first recording layer, $t_{x1}$, and the crystallization time of the second recording layer, $t_{x2}$, have the relationship $t_{x1} > t_{x2}$, and
   $R_{a1} + R_{a2}$, $R_{a1} + R_{c2}$, $R_{c1} + R_{a2}$, and $R_{c1} + R_{c2}$ are different from one another where the resistance value of the first recording layer in the amorphous phase is $R_{a1}$, the resistance value of the first recording layer in the crystalline phase is $R_{c1}$, the resistance value of the second recording layer in the amorphous phase is $R_{a2}$, and the resistance value of the second recording layer in the crystalline phase is $R_{c2}$.

2. A memory according to claim 1, wherein the melting point of the first recording layer, $T_{m1}$, satisfies the relationship $400 \leq T_{m1}(°\text{ C.}) \leq 800$.

3. A memory according to claim 1, wherein the melting point of the second recording layer, $T_{m2}$, satisfies the relationship $300 \leq T_{m2}(°\text{ C.}) \leq 700$.

4. A memory according to claim 1, wherein the crystallization temperature of the first recording layer, $T_{x1}$, satisfies the relationship $130 \leq T_{x2}(°\text{ C.}) \leq 230$.

5. A memory according to claim 1, wherein the crystallization temperature of the second recording layer, $T_{x2}$, satisfies the relationship $160 \leq T_{x2}(°\text{ C.}) \leq 260$.

6. A memory according to claim 1, wherein the crystallization time of the first recording layer, $t_{x1}$, satisfies the relationship $5 \leq t_{x1}(\text{ns}) \leq 200$.

7. A memory according to claim 1, wherein the crystallization time of the second recording layer. $t_{x2}$, satisfies the relationship $2 \leq t_{x2}(\text{ns}) \leq 150$.

8. A memory according to claim 1, wherein:
   the first recording layer includes three elements, Ge, Sb, and Te; and
   the second recording layer includes (Sb-Te)-Ml, where Ml Is at least one selected from a group consisting of Ag, In, Ge, Sn, Se, Bi, Au, and Mn.

9. A memory according to claim 1, wherein the first recording layer is formed on a substrate, and the upper electrode is formed on the second recording layer.

10. A memory according to claim 9, wherein a lower electrode is formed between the substrate and the first recording layer.

11. A memory according to claim 1, wherein an intermediate layer is formed between the first recording layer and the second recording layer.

12. A memory according to claim 1, wherein the specific resistance $r_{a1}$ of the first recording layer in the amorphous phase is $1.0 \leq r_{a1}(\Omega\cdot\text{cm}) \leq 1 \times 10^7$.

13. A memory according to claim 1, wherein the specific resistance $r_{a2}$ of the second recording layer in the amorphous phase $2.0 \leq r_{a2}(\Omega\cdot\text{cm}) \leq 2 \times 10^7$.

14. A memory according to claim 1, wherein the specific resistance $r_{c1}$ of the first recording layer in the crystalline phase is $1 \times 10^{-3} \leq r_{c1}(\Omega\cdot\text{cm}) \leq 1.0$.

15. A memory according to claim 1, wherein the specific resistance $r_{c2}$ of the second recording layer in the crystalline phase is $1 \times 10^{-3} \leq r_{c2}(\Omega\cdot\text{cm}) \leq 1.0$.

16. A writing apparatus for writing information in a memory, the memory including:
   a first recording layer for recording information by utilizing a reversible phase change between a crystalline phase and an amorphous phase which occurs due to increases in temperature caused by application of an electric current pulse; and
   a second recording layer for recording information by utilizing a reversible phase change between a crystalline phase and an amorphous phase which occurs due to increases in temperature caused by application of an electric current pulse,
   wherein the crystallization temperature of the first recording layer, $T_{x1}$, and the crystallization temperature of the second recording layer, $T_{x2}$, have the relationship $T_{x1} < T_{x2}$,
   the crystallization time of the first recording layer, $t_{x1}$, and the crystallization time of the second recording layer, $t_{x2}$, have the relationship $t_{x1} > t_{x2}$, and
   $R_{a1} + R_{a2}$, $R_{a1} + R_{c2}$, $R_{c1} + R_{a2}$, and $R_{c1} + R_{c2}$ are different from one another where the resistance value of the first recording layer in the amorphous phase is $R_{a1}$, the resistance value of the first recording layer in the crystalline phase is $R_{c1}$, the resistance value of the second recording layer in the amorphous phase is $R_{a2}$, and the resistance value of the second recording layer in the crystalline phase is $R_{c2}$, and
   the writing apparatus including:
   a pulse generator for generating at least first to third electric current pulses; and
   an application section through which the at least first to third electric current pulses are applied to the first recording layer and the second recording layer,
   wherein in order to change the first recording layer from the amorphous phase to the crystalline phase while the phase state of the second recording layer is kept unchanged, the pulse generator generates the first electric current pulse which provides a temperature (T) that satisfies $T_{x1} \leq T < T_{x2}$ during a time (t) that satisfies $t_{x1} \leq t$,
   in order to change the second recording layer from the amorphous phase to the crystalline phase while the phase state of the first recording layer is kept unchanged, the pulse generator generates the second electric current pulse which provides a temperature (T) that satisfies $T_{x2} \leq T$ during a time (t) that satisfies $t_{x2} \leq t < t_{x1}$, and
   in order to change both the first recording layer and the second recording layer from the crystalline phase to the amorphous phase, the pulse generator generates the third electric current pulse which provides a temperature equal to or higher than the higher one of the melting points of the first and second recording layers.

17. A writing apparatus according to claim 16, wherein the pulse amplitude of the first electric current pulse, $I_{c1}$, is $0.02 \leq I_{c2}(mA) \leq 10$, and the pulse width of the first electric current pulse, $t_{c1}$, is $5 \leq t_{c1}(ns) \leq 200$.

18. A writing apparatus according to claim 16, wherein the pulse amplitude of the second electric current pulse, $I_{c2}$, is $0.05 \leq I_{c2}(mA) \leq 20$, and the pulse width of the second electric current pulse, $t_{c2}$, is $2 \leq t_{c2}(ns) \leq 150$.

19. A writing apparatus according to claim 16, wherein the pulse amplitude of the third electric current pulse, $I_{a1}$, is $0.1 \leq I_{a1}(mA) \leq 200$, and the pulse width of the third electric current pulse, $t_{a1}$, is $1 \leq t_{a1}(ns) \leq 100$.

20. A writing apparatus according to claim 16, wherein, in order to change both the first recording layer and the second recording layer from the amorphous phase to the crystalline phase, the pulse generator generates a fourth electric current pulse which provides a temperature (T) that satisfies $T_{x2} \leq T$ during a time (t) that satisfies $t_{x1} \leq t$.

21. A writing apparatus according to claim 20, wherein the pulse amplitude of the fourth electric current pulse, $I_{c12}$, is $0.05 \leq I_{c12}(mA) \leq 20$, and the pulse width of the fourth electric current pulse, $t_{c12}$, is $5 \leq t_{c12}(ns) \leq 200$.

22. A writing apparatus according to claim 16, wherein, when the melting point of the first recording layer, $T_{m1}$, and the melting point of the second recording layer, $T_{m2}$, have the relationship $T_{m1} \neq T_{m2}$, in order to change the recording layer having the lower one of the melting points $T_{m1}$ and $T_{m2}$ from the crystalline phase to the amorphous phase while the phase state of the recording layer having the higher one of the melting points $T_{m1}$ and $T_{m2}$ is kept at the crystalline phase, the pulse generator generates a fifth electric current pulse which provides a temperature equal to or higher than the lower one of the melting points $T_{m1}$ and $T_{m2}$ and lower then the higher one of the melting points $T_{m1}$ and $T_{m2}$.

23. A writing apparatus according to claim 22, wherein the pulse amplitude of the fifth electric current pulse, $I_{a2}$, is $0.05 \leq I_{a2}(mA) \leq 160$, and the pulse width of the fifth electric current pulse, $t_{a2}$, is $1 \leq t_{a2}(ns) \leq 100$.

24. A reading apparatus for reading information from a memory, the memory including:
  a first recording layer for recording information by utilizing a reversible phase change between a crystalline phase and an amorphous phase which occurs due to increases in temperature caused by application of an electric current pulse; and
  a second recording layer for recording information by utilizing a reversible phase change between a crystalline phase and an amorphous phase which occurs due to increases in temperature caused by application of an electric current pulse,
  wherein the crystallization temperature of the first recording layer, $T_{x1}$, and the crystallization temperature of the second recording layer, $T_{x2}$, have the relationship $T_{x1} < T_{x2}$,
  the crystallization time of the first recording layer, $t_{x1}$, and the crystallization time of the second recording layer, $t_{x2}$, have the relationship $t_{x1} > t_{x2}$, and
  $R_{a1}+R_{a2}$, $R_{a1}+R_{c2}$, $R_{c1}+R_{a2}$, and $R_{c1}+R_{c2}$ are different from one another where the resistance value of the first recording layer in the amorphous phase is $R_{a1}$, the resistance value of the first recording layer in the crystalline phase is $R_{c1}$, the resistance value of the second recording layer in the amorphous phase is $R_{a2}$, and the resistance value of the second recording layer in the crystalline phase is $R_{c2}$, and
  the reading apparatus including:
    an application section through which an electric current pulse is applied to the first and second recording layers;
    a resistance measurement device for measuring a sum of the resistances of the first and second recording layers; and
    a determination section for determining which of the four different sums of resistance values, $R_{c1}+R_{a2}$, $R_{a1}+R_{c2}$, $R_{c1}+R_{a2}$, and $R_{c1}+R_{c2}$, the measured sum of the resistance values of the first and second recording layers is equal to.

25. A reading apparatus according to claim 24, wherein the electric current pulse has an amplitude $I_r$ having a size such that a phase change is not caused in the first and second recording layers.

26. A reading apparatus according to claim 25, wherein the amplitude $I_r$ of the electric current pulse is $I_r(mA) \leq 0.02$.

27. A memory, comprising
  N recording layers (N is a natural number which satisfies N>2) for recording information by utilizing a reversible phase change between a crystalline phase and an amorphous phase which occurs due to increases in temperature caused by application of an electric current pulse,
  wherein the crystallization temperature $T_{xm}$ of the m-th recording layer ($1 \leq m \leq N$) satisfies the relationship $T_{x1} < T_{x2} < \ldots < T_{xm-1} < T_{xm} < T_{xm+1} < \ldots < T_{xN-1}$
  the crystallization time $t_{xm}$ of the m-th recording layer satisfies the relationship $t_{x1} > t_{x2} > \ldots > t_{xm-1} > t_{xm} > t_{xm+1} > \ldots > t_{xN}$, and
  the resistance values of the N recording layers in the amorphous phase are different from one another, the resistance values of the N recording layers in the crystalline phase are different from one another, and the sum of the resistance values of the N recording layers is one of $2^N$ values.

28. A writing apparatus for writing information in a memory, the memory including
  N recording layers (N is a natural number which satisfies N>2) for recording information by utilizing a reversible phase change between a crystalline phase and an amorphous phase which occurs due to increases in temperature caused by application of an electric current pulse,
  wherein the crystallization temperature $T_{xm}$ of the m-th recording layer ($1 \leq m \leq N$) satisfies the relationship $T_{x1} < T_{x2} < \ldots < T_{xm-1} < T_{xm} < T_{xm+1} < \ldots < T_{xN}$,
  the crystallization time $t_{xm}$ of the m-th recording layer satisfies the relationship $t_{x1} > t_{x2} > \ldots > t_{xm-1} > t_{xm} > t_{xm+1} > \ldots > t_{xN}$, and
  the resistance values of the N recording layers in the amorphous phase are different from one another, the resistance values of the N recording layers in the crystalline phase are different from one another, and the sum of the resistance values of the N recording layers is one of $2^N$ values, and
  the writing apparatus including:
    a pulse generator for generating at least N crystallization pulses and amorphization pulse, and
    an application section through which the at least N crystallization pulses and amorphization pulse are applied to the N recording layers,
    wherein in order to change only the m-th recording layer from the amorphous phase to the crystalline phase while the phase states of the other recording layers are kept unchanged, the pulse generator generates a crystallization pulse which provides a temperature (T) that satisfies $T_{xm} \leq T_x < T_{x(m+1)}$ during a time (t) that satisfies $t_{xm} \leq t_x < t_{x(m-1)}$, and in order to change all of the N recording layers from the crystalline phase to the amorphous phase, the pulse generator generates the amorphization pulse which provides a temperature equal to or higher than the highest one of the melting points of the N recording layers.

29. A writing apparatus according to claim 28, wherein, in order to change all of the N recording layers from the amorphous phase to the crystalline phase, the pulse generator generates an electric current pulse which provides a temperature (T) that satisfies $T_{xN} \leq T_x$ during a time (t) that satisfies $t_{x1} \leq t_x$.

30. A writing apparatus according to claim 28, wherein, in order to change the m-th to (m+n−1) th recording layers among the N recording layers from the amorphous phase to the crystalline phase, the pulse generator generates an electric current pulse which provides a temperature (T) that satisfies $T_{x(m+n-1)} \leq T_x < T_{x(m+n)}$ during a time (t) that satisfies $t_{xm} \leq t_x < t_{x(m-1)}$.

31. A writing apparatus according to claim 28, wherein, when each of one or more recording layers among the N recording layers has a melting point equal to or lower than a temperature $T_m$, and each of the other recording layers among the N recording layers has a melting point higher than the temperature $T_m$, in order to change the one or more recording layers from the crystalline phase to the amorphous phase while the other recording layers are kept at the crystalline phase, the pulse generator generates an electric current pulse which produces the temperature $T_m$.

32. A reading apparatus for reading information from a memory, the memory including N recording layers (N is a natural number which satisfies N>2) for recording information by utilizing a reversible phase change between a crystalline phase and an amorphous phase which occurs due to increases in temperature caused by application of an electric current pulse, wherein the crystallization temperature $T_{xm}$ of the m-th recording layer ($1 \leq m \leq N$) satisfies the relationship $T_{x1} < T_{x2} < \ldots < T_{xm-1} < T_{xm} < T_{xm+1} < \ldots < T_{xN}$, the crystallization time $t_{xm}$ of the m-th recording layer satisfies the relationship $t_{x1} > t_{x2} > \ldots > t_{xm-1} > t_{xm} > t_{xm+} > \ldots > t_{xN}$, and the resistance values of the N recording layers in the amorphous phase are different from one another, the resistance values of the N recording layers in the crystalline phase are different from one another, and the sum of the resistance values of the N recording layers is one of $2^N$ values, and the reading apparatus including:
an application section through which an electric current pulse is applied to the N recording layers:
a resistance measurement device for measuring a sum of the resistances of the N recording layers; and
a determination section for determining which of the $2^N$ different values for the sum of resistance values the measured sum of the resistance values of the N recording layers is equal to.

33. A method for writing information in a memory, the memory including:
a first recording layer for recording information by utilizing a reversible phase change between a crystalline phase and an amorphous phase which occurs due to increases in temperature caused by application of an electric current pulse; and a second recording layer for recording information by utilizing a reversible phase change between a crystalline phase and an amorphous phase which occurs due to increases in temperature caused by application of an electric current pulse, wherein the crystallization temperature of the first recording layer, $T_{x1}$, and the crystallization temperature of the second recording layer, $T_{x2}$, have the relationship $T_{x1} < T_{x2}$, the crystallization time of the first recording layer, $t_{x1}$, and the crystallization time of the second recording layer, $t_{x2}$, have the relationship $t_{x1} > t_{x2}$, and $R_{a1}+R_{a2}$, $R_{a1}+R_{c2}$, $R_{c1}+R_{a2}$, and $R_{c1}+R_{c2}$ are different from one another where the resistance value of the first recording layer in the amorphous phase is $R_{a1}$, the resistance value of the first recording layer in the crystalline phase is $R_{c1}$, the resistance value of the second recording layer in the amorphous phase is $R_{a2}$, and the resistance value of the second recording layer in the crystalline phase is $R_{c2}$, and the writing method including steps of:
generating at least first to third electric current pulses; and
applying the at least first to third electric current pulses to the first recording layer and the second recording layer, wherein, in the step of generating the at least first to third electric current pulses, in order to change the first recording layer from the amorphous phase to the crystalline phase while the phase state of the second recording layer is kept unchanged, the pulse generator generates the first electric current pulse which provides a temperature (T) that satisfies $T_{x1} \leq T < T_{x2}$ during a time (t) that satisfies $t_{x1} \leq t$, in order to change the second recording layer from the amorphous phase to the crystalline phase while the phase state of the first recording layer is kept unchanged, the pulse generator generates the second electric current pulse which provides a temperature (T) that satisfies $T_{x2} \leq T$ during a time (t) that satisfies $t_{x2} \leq t < t_{x1}$, and in order to change both the first recording layer and the second recording layer from the crystalline phase to the amorphous phase, the pulse generator generates the third electric current pulse which provides a temperature equal to or higher than the higher one of the melting points of the first and second recording layers.

34. A method for reading information from a memory, the memory including:
a first recording layer for recording information by utilizing a reversible phase change between a crystalline phase and an amorphous phase which occurs due to increases in temperature caused by application of an electric current pulse; and a second recording layer for recording information by utilizing a reversible phase change between a crystalline phase and an amorphous phase which occurs due to increases in temperature caused by application of an electric current pulse, wherein the crystallization temperature of the first recording layer, $T_1$, and the crystallization temperature of the second recording layer, $T_{x2}$, have the relationship $T_{x1} < T_{x2}$, the crystallization time of the first recording layer, $t_{x1}$, and the crystallization time of the second recording layer, $t_{x2}$, have the relationship $t_{x1} > t_{x2}$, and $R_{a1}+R_{a2}$, $R_{a1}+R_{c2}$, $R_{c1}+R_{a2}$, and $R_{c1}+R_{c2}$ are different from one another where the resistance value of the first recording layer in the amorphous phase is $R_{a1}$, the resistance value of the first recording layer in the crystalline phase is $R_{c1}$, the resistance value of the second recording layer in the amorphous phase is $R_{a2}$, and the resistance value of the second recording layer in the crystalline phase is $R_{c2}$, and the reading method including steps of:
  applying an electric current pulse to the first recording layer and the second recording layer;
  measuring a sum of the resistances of the first and second recording layers; and
  determining which of the four different sums of resistance values, $R_{a1}+R_{a2}$, $R_{a1}+R_{c2}$, $R_{c1}+R_{a2}$, and $R_{c1}+R_{c2}$, the measured sum of the resistance values of the first and second recording layers is equal to.

35. A method for writing information in a memory, the memory including

N recording layers (N is a natural number which satisfies N>2) for recording information by utilizing a reversible phase change between a crystalline phase and an amorphous phase which occurs due to increases in temperature caused by application of an electric current pulse, wherein the crystallization temperature $T_{xm}$ of the m-th recording layer ($1 \leq m \leq N$) satisfies the relationship $T_{x1} > T_{x2} > \ldots > T_{xm-1} > T_{xm} > T_{xm+1} > \ldots > T_{xN}$, the crystallization time $t_{xm}$ of the m-th recording layer satisfies the relationship $t_{x1} > t_{x2} > \ldots > t_{xm-} > t_{xm} > t_{xm+1} + > \ldots > t_{xN}$, and the resistance values of the N recording layers in the amorphous phase are different from one another, the resistance values of the N recording layers in the crystalline phase are different from one another, and the sum of the resistance values of the N recording layers is one of $2^N$ values, and the writing method including steps of:
  generating at least N crystallization pulses and amorphization pulse, and
  applying the at least N crystallization pulses and amorphization pulse to the N recording layers, wherein, in the step of generating the first to (N+1)th electric current pulses, in order to change only the m-th recording layer from the amorphous phase to the crystalline phase while the phase states of the other recording layers are kept unchanged, the pulse generator generates a crystallization pulse which provides a temperature (T) that satisfies $T_{xm} \leq T_x < T_{x(m+1)}$ during a time (t) that satisfies $t_{xm} \leq t_x < t_{x(m-1)}$, and in order to change all of the N recording layers from the crystalline phase to the amorphous phase, the pulse generator generates the amorphization pulse which provides a temperature equal to or higher than the highest one of the melting points of the N recording layers.

36. A method for reading information from a memory, the memory including

N recording layers (N is a natural number which satisfies N>2) for recording information by utilizing a reversible phase change between a crystalline phase and an amorphous phase which occurs due to increases in temperature caused by application of an electric current pulse, wherein the crystallization temperature $T_{xm}$ of the m-th recording layer ($1 \leq m \leq N$) satisfies the relationship $T_{x1} < T_{x2} < \ldots < T_{xm-1} < T_{xm} < T_{xm+1} < \ldots < T_{xN}$, the crystallization time $t_{xm}$ of the m-th recording layer satisfies the relationship $t_{x1} > t_{x2} > \ldots > t_{xm-1} > t_{xm} > t_{xm+1} > \ldots > t_{xN}$, and the resistance values of the N recording layers in the amorphous phase are different from one another, the resistance values of the N recording layers in the crystalline phase are different from one another, and the sum of the resistance values of the N recording layers is one of $2^N$ values, and the reading method including steps of:
  applying an electric current pulse to the N recording layers;
  measuring a sum of the resistances of the N recording layers; and
  determining which of the $2^N$ different values for the sum of resistance values the measured sum of the resistance values of the N recording layers is equal to.

* * * * *

UNITED STATES PATENT AND TRADEMARK OFFICE
CERTIFICATE OF CORRECTION

PATENT NO. : 6,809,401 B2
DATED : October 26, 2004
INVENTOR(S) : Takashi Nishihara, Rie Kojima and Noboru Yamada It is certified that error appears in the above-identified patent and that said Letters Patent is hereby corrected as shown below:

Title page,
Item [57], ABSTRACT,
Line 6, after "$T_{x2}$" insert -- ,(comma) --; and
Line 14, after "$R_{a2}$" insert --, (comma) --.

Column 29,
Line 46, change "$T_{x2}$" to -- $T_{x1}$ --;
Line 54, change "layer." to -- layer, --; and
Line 60, change "Is" to -- is --.

Column 30,
Line 9, after "phase" insert -- is --.

Column 32,
Line 11, change "$R_{c1}$" to -- $R_{a1}$ --; and
Line 30, change "$T_{xN-1}$" to -- $T_{xN}$ --.

Column 33,
Line 47, change "$t_{xm+}$" to -- $t_{xm+1}$ --.

Column 34,
Line 65, change "$T_1$" to -- $T_{x1}$ --.

Column 35,
Line 31, change ">" (all occurrences) to -- < --; and
Line 33, change "$t_{xm-}$" to -- $t_{xm-1}$ -- and
Line 34, change "$t_{xm-1}+>...>t_{xN}$" to -- $t_{xm-1}>...>t_{xN}$ --.

UNITED STATES PATENT AND TRADEMARK OFFICE
CERTIFICATE OF CORRECTION

PATENT NO. : 6,809,401 B2
DATED : October 26, 2004
INVENTOR(S) : Takashi Nishihara, Rie Kojima and Noboru Yamada It is certified that error appears in the above-identified patent and that said Letters Patent is hereby corrected as shown below:

Column 36,
Line 7, change "$\leq_{Tx}$" to -- $\leq T_x$ --.

Signed and Sealed this

Fifth Day of April, 2005

JON W. DUDAS
*Director of the United States Patent and Trademark Office*